United States Patent [19]

Aoai et al.

[11] Patent Number: 5,683,856
[45] Date of Patent: Nov. 4, 1997

[54] POSITIVE-WORKING PHOTOSENSITIVE COMPOSITION

[75] Inventors: Toshiaki Aoai; Tsukasa Yamanaka; Kazuya Uenishi, all of Shizuoka, Japan

[73] Assignee: Fuji Photo Film Co., Ltd., Kanagawa, Japan

[21] Appl. No.: 634,529

[22] Filed: Apr. 18, 1996

Related U.S. Application Data

[63] Continuation-in-part of Ser. No. 525,157, Sep. 8, 1995, abandoned.

[30] Foreign Application Priority Data

Oct. 18, 1994 [JP] Japan .................................. 6-252351

[51] Int. Cl.$^6$ ........................................................ G03C 1/492
[52] U.S. Cl. ........................................ 430/270.1; 430/326
[58] Field of Search ................................. 430/270.1, 326

[56] References Cited

FOREIGN PATENT DOCUMENTS

| | | |
|---|---|---|
| 0541112 | 5/1993 | European Pat. Off. . |
| 06119998 | 8/1994 | European Pat. Off. . |
| 4 75062 | 3/1992 | Japan . |
| 6273924 | 9/1994 | Japan . |
| 7128859 | 5/1995 | Japan . |
| 94 01805 | 1/1994 | WIPO . |

OTHER PUBLICATIONS

Patent Abstracts of Japan, Abstract of JP-A 63 149 640.

*Primary Examiner*—Mark Chapman
*Attorney, Agent, or Firm*—Sughrue, Mion, Zinn, Macpeak & Seas, PLLC

[57] ABSTRACT

A positive working photosensitive composition is disclosed, which comprises:

(a) a resin which is insoluble in water but soluble in an alkaline aqueous solution;

(b) a compound which generates an acid upon irradiation with active light or radiation;

(c) a low molecular acid-decomposable dissolution-inhibitive compound having a molecular weight of 3,000 or less and containing a group decomposable with an acid, and which increases its solubility in an alkaline developer by the action of an acid; and (d) a resin containing a basic nitrogen atom and having a weight-average molecular weight of 2,000 or more.

A further positive working photosensitive composition is disclosed, which comprises:

(1) a compound which generates an acid upon irradiation with active light or radiation;

(2) a resin having a group which undergoes decomposition by an acid whereby increasing its solubility in an alkaline developer; and (3) a resin containing a basic nitrogen atom and having a weight-average molecular weight of 2,000 or more.

The positive-working photosensitive composition of the present invention can easily and properly inhibit acid diffusion and acid deactivation on the surface thereof with time between the exposure and the heat treatment, keep the dissolution inhibiting effect exerted by the dissolution-inhibitive compound and exhibit a good profile, a high sensitivity and a high resolving power.

5 Claims, No Drawings

1

POSITIVE-WORKING PHOTOSENSITIVE COMPOSITION

This is a File Wrapper Continuation-in-Part Application of application Ser. No. 08/525,157, filed Sep. 8, 1995 now abandoned.

FIELD OF THE INVENTION

The present invention relates to a positive working photosensitive composition which can be used for a lithographic printing plate or during the manufacturing of a semiconductor such as an integrated circuit (IC), or during the manufacturing of a circuit board for a liquid crystal, thermal head and other photofabrication processes.

BACKGROUND OF THE INVENTION

As positive working photoresist compositions there are normally used compositions comprising an alkali-soluble resin and a naphthoquinonediazide compound as a photosensitive material. Examples of such compositions include novolak phenol resin/naphthoquinonediazide-substituted compounds as disclosed in U.S. Pat. Nos. 3,666,473, 4,115, 128, and 4,173,470. Most typical examples of such compositions include novolak resin composed of cresol-formaldehyde/trihydroxybenzophenone-1,2-naphthoquinonediazidesulfonic ester as disclosed in L. F. Thompson, *Introduction to Microlithography*, ACS, No. 2, vol. 19, pp. 112–121.

In such a positive working photoresist essentially composed of a novolak resin and a quinonediazide compound, the novolak resin provides a high resistance against plasma etching while the naphthoquinone diazide compound serves as a dissolution-inhibitive compound. Further, when irradiated with light, the naphthoquinone diazide compound produces a carboxylic acid to lose its dissolution-inhibitive ability, whereby increasing the alkali solubility of the novolak resin.

From such a standpoint of view, many positive working photoresists comprising a novolak resin and a naphthoquinone diazide photosensitive material have heretofore been developed and put into practical use. These positive working photoresists have provided satisfactory results in the working of fine lines having a width of about 0.8 μm to 2 μm.

However, integrated circuits have developed its degree of integration more and more. In the production of semiconductor substrates such as VLSI (very large scale integrated circuit), the working of ultrafine patterns composed of lines having a width of not more than a half micron has been required. In order to attain the required resolving power, the wavelength of exposure light used in the exposure apparatus for photolithography has been shifted to shorter ranges. At present, the use of far ultraviolet rays, excimer lasers (e.g., XeCl, KrF, ArF), etc. is under review.

When a conventional resist composed of a novolak and a naphthoquinone diazide compound is used for the formation of a pattern in lithography employing far ultraviolet rays or excimer laser, the light can hardly reach the bottom of the resist because the novolak and naphthoquinonediazide compounds exhibit a strong absorption in the far ultraviolet region, whereby giving only a tapered pattern having a low sensitivity.

One of the means for solving such a problem is a chemically-sensitized resist composition as disclosed in U.S. Pat. No. 4,491,628 and European Patent 249,139. A chemically-sensitized resist composition is a pattern-forming material which, when irradiated with radiation such as far ultraviolet rays, produces at the exposed area an acid which then serves as a catalyst to cause a reaction that changes the solubility of the area irradiated with active radiation and the non-irradiated area in a developer whereby forming a pattern on a substrate.

Examples of such a chemically-sensitized resist composition include a combination of a compound which undergoes photodecomposition to produce an acid with an acetal or O,N-acetal (as disclosed in JP-A-48-89003 (The term "JP-A" as used herein means an "unexamined published Japanese patent application")), a combination of a compound which undergoes photodecomposition to produce an acid with an orthoester or amide acetal compound (as disclosed in JP-A-51-120714), a combination of a compound which undergoes photo-decomposition to produce an acid with a polymer having an acetal or ketal group in its main chain (as disclosed in JP-A-53-133429), a combination of a compound which undergoes photodecomposition to produce an acid with an enolether compound (as disclosed in JP-A-55-12995), a combination of a compound which undergoes photodecomposition to produce an acid with an N-acyliminocarbonic acid compound (as disclosed in JP-A-55-126236), a combination of a compound which undergoes photodecomposition to produce an acid with a polymer having an orthoester group in its main chain (as disclosed in JP-A-56-17345), a combination of a compound which undergoes photodecomposition to produce an acid with a tertiary alkylester compound (as disclosed in JP-A-60-3625), a combination of a compound which undergoes photo-decomposition to produce an acid with a silylester compound (as disclosed in JP-A-60-10247), and a combination of a compound which undergoes photodecomposition to produce an acid with a silylether compound (as disclosed in JP-A-60-37549 and JP-A-60-121446). Such a chemically-sensitized resist composition exhibits a quantum yield of more than 1 in principle and thus has a high photosensitivity.

Similarly, examples of a system which normally stays stable but decomposes on heating in the presence of an acid to become alkali-soluble include a combination of a compound which produces an acid upon exposure to light with an ester of secondary or tertiary carbon (e.g., t-butyl, 2-cyclohexenyl) or carbonic ester compound as disclosed in JP-A-59-45439, JP-A-60-3625, JP-A-62-229242, JP-A-63-27829, JP-A63-36240, JP-A-63-250642, *Polym. Eng. Sce.*, vol. 23, page 1012 (1983), *ACS. Sym.*, vol. 242, page 11 (1984), *Semiconductor World* 1987, Nov. page 91, *Macromolecules*, vol. 21, page 1475 (1988), and *SPIE*, vol. 920, page 42 (1988). These systems also have a high photosensitivity. In addition, these systems exhibit a small absorption in the deep ultraviolet region as compared with the naphthoquinone diazide/novolak resin. Thus, they can serve as an effective system for light source having a shorter wavelength.

The foregoing positive working chemically-sensitized resist composition can be roughly divided into two groups, i.e., 3-component system consisting of an alkali-soluble resin, a compound which produces an acid upon exposure to radiation and a compound having an acid-decomposable group which inhibits the dissolution of the alkali-soluble resin, and 2-component system consisting of a resin having a group which reacts with an acid to become alkali-soluble and a photo acid generator.

The 2-component or 3-component system positive-working chemically-sensitized resist is subjected to heat treatment in the presence of an acid generated from a photo-acid generator upon exposure, followed by development to form thereby a resist pattern. However, these 2-component or 3-component system positive-working chemically-sensitized resist is disadvantageous in that, as the standing time between exposure and heat treatment (PEB treatment) is prolonged, it is more likely that the acid thus generated may diffuse or the acid on the surface of the resist may be deactivated by basic impurities in the atmosphere, whereby causing a change in sensitivity and profile or line width of resist pattern after development.

As an approach for resolving these problems there has been proposed a technique for adding a low molecular amine to a chemically-sensitized system as disclosed in JP-A-63-149640, JP-A-5-232706, JP-A-5-249662, JP-A-5-127369, and WO-94/1805.

However, the foregoing approach is disadvantageous in that the low molecular amine can easily migrate in the resist film. Thus, the low molecular amine vaporizes and diffuses during the coating and drying of the resist solution and the process between exposure and PEB treatment thereof, whereby impairing the effect exerted by the addition of the amine.

On the other hand, JP-A-4-75062 reports that the incorporation of a tertiary amine in a base polymer makes it possible to inhibit the diffusion of an acid generated upon exposure and hence enhancing the dimensional accuracy of the resist pattern. However, this approach is disadvantageous in that the amount of the tertiary amine to be used needs to be closely controlled depending on the generated amount of the acid. If a tertiary amine is introduced into a base polymer as in the foregoing technique, it is actually difficult to provide a close control over the content of the amine in the polymer depending on the generated amount of the acid. Further, if a base polymer containing a tertiary amine is used, the effect of the base polymer itself becomes insufficient, thereby causing elution of the nonimage area upon development or causing scumming on the image area.

SUMMARY OF THE INVENTION

It is therefore an object of the present invention to provide a positive working photosensitive composition which can easily and properly inhibit acid diffusion or deactivation of an acid during the time between the exposure and the heat treatment, provides an improvement in the dissolution inhibitive effect or developability and exhibits a good profile and a high resolving power.

The inventors made extensive studies taking into account the foregoing various performances. As a result, it was found that the foregoing object of the present invention can be accomplished with a 3-component or 2-component system positive working chemically-sensitized system employing the following high molecular resin containing a group containing a basic nitrogen atom. Thus, the present invention has been completed.

The present invention concerns a positive working photosensitive composition which comprises:

(a) a resin which is insoluble in water but soluble in an alkaline aqueous solution;

(b) a compound which generates an acid upon irradiation with active light or radiation;

(c) a low molecular acid-decomposable dissolution-inhibitive compound having a molecular weight of 3,000 or less and containing a group decomposable with an acid, and which increases its solubility in an alkaline developer by the action of an acid; and (d) a resin containing a basic nitrogen atom and having a weight-average molecular weight of 2,000 or more.

The present invention also concerns a positive-working photosensitive composition which comprises:

(1) a compound which generates an acid upon irradiation with active light or radiation;

(2) a resin containing a group which undergoes decomposition by an acid whereby increasing its solubility in an alkaline developer; and (3) a resin containing a basic nitrogen atom and having a weight-average molecular weight of 2,000 or more.

As mentioned above, if a high molecular weight resin containing a group containing a basic nitrogen atom is incorporated in a 3-component or 2-component system chemically-sensitized resist, the content of a basic nitrogen atom in the resist can be closely controlled by properly controlling the content of a basic nitrogen atom in the resin or controlling the amount of the resin to be incorporated in the resist. Thus, the amount of the basic nitrogen atom to be added can be easily and properly controlled depending on the amount of an acid generated upon exposure. This makes it possible to obtain a positive working photosensitive composition which can inhibit the diffusion of excess acid or the deactivation of an acid on the surface of the resist and exhibits a good profile and a high resolving power.

Further, the present invention is characterized in that no basic nitrogen atom is introduced into the base polymer which is the main component of the 3-component or 2-component system resist, but a basic nitrogen atom is incorporated in the resist as an additional component in the form of a polymer. This provides a good interaction between the base polymer (alkali-soluble resin) and the dissolution-inhibitive compound, whereby making it possible to maintain the effect of the dissolution-inhibitive compound of inhibiting the dissolution of the nonimage area during development and hence inhibit the elution of the nonimage area. Thus, a positive working photosensitive composition which can prevent the image area from being left undeveloped and exhibits a good profile and a high resolving power can be obtained.

DETAILED DESCRIPTION OF THE INVENTION

The compounds to be used in the present invention will be further described hereinafter.

(I) Resin containing basic nitrogen atom and having weight-average molecular weight of 2,000 or more:

The resin containing a basic nitrogen atom to be used in the present invention is a resin having a weight-average molecular weight of 2,000 or more and having a functional group containing a basic nitrogen atom (hereinafter abbreviated as a "basic group") in its main chain or side chain.

Examples of the basic group include amino group, an N-alkyl-substituted amino group, an N-aryl-substituted amino group, an N-aralkyl-substituted amino group, an N,N-dialkyl-substituted amino group, an N,N-aryl-substituted amino group, an N,N-diaralkyl-substituted amino group, an N-alkyl-N-aryl-substituted amino group, and an N-alkyl-N-aralkyl-substituted amino group. Preferred examples of the foregoing alkyl group to be connected to the nitrogen atom include $C_{1-12}$ alkyl groups, more preferably $C_{1-4}$ alkyl groups such as methyl, ethyl, propyl and butyl. Preferred examples of the foregoing aryl group to be connected to the nitrogen atom include $C_{6-10}$ aryl groups, more preferably $C_{6-10}$ aryl groups such as phenyl, tollyl and naphthyl. Preferred examples of the foregoing aralkyl group to be connected to the nitrogen atom include $C_{7-10}$ aralkyl groups, more preferably $C_{7-10}$ aralkyl groups such as benzyl and 4-methylbenzyl. These alkyl, aryl and aralkyl groups may further contain substituents such as alkoxy group (e.g., methoxy, ethoxy), a halogen atom (e.g., chlorine, bromine), cyano group, carboxyl group, an alkoxycarbonyl group (e.g., methoxycarbonyl, ethoxycarbonyl), hydroxyl group, tetraalkylammonium group and nitro group.

Specific examples of the basic group include amino group, N-methylamino group, N-ethylamino group, N-propylamino group, N-(2-methoxyethyl)amino group, N-butylamino group, N-phenylamino group, N-benzylamino group, N-(4-methoxyphenyl)-amino group, N-(4-chlorophenyl)amino group, N,N-dimethylamino group, N,N-diethylamino group, N,N-dipropylamino group, N,N-dibutylamino group, N,N-diphenylamino group, N,N-dibenzylamino group, N-methyl-N-phenylamino group, N-methyl-N-benzylamino group, N-ethyl-N-phenylamino group, N-ethyl-N-benzylamino group, and N-ethyl-N-(2-hydroxyethyl)amino group. However, the present invention should not be construed as being limited to these compounds.

Another examples of the basic group include nitrogen-containing 6-membered heterocyclic groups such as piperidyl group, piperazinyl group, morpholinyl group, quinuclidinyl group, pyridyl group, pyrazinyl group, pyrimidinyl group, quinolyl group, isoquinolyl group, naphthylidinyl group, quinoxalinyl group, quinazolinyl group, purinyl group, acridinyl group and phenothiadinyl group; and nitrogen-containing 5-membered heterocyclic groups such as pyrrolidinyl group, pyrrolynyl group, pyrrolyl group, imidazolidinyl group, imidazolinyl group, imidazolyl group, pyrazolyl group, indolinyl group, indolyl group, isoindonilyl group, isoindolyl group, carbazolyl group, oxazolyl group and thiazolyl group. These heterocyclic groups may have a substituent selected from the foregoing alkyl group, aryl group, aralkyl group, alkoxy group, halogen atom, carboxyl group, alkoxycarbonyl group and hydroxyl group, and mercapto group.

The foregoing resin containing a basic group and having a weight-average molecular weight of 2,000 or more (hereinafter may be abbreviated as "basic group-containing resin") may be synthesized by the following methods.

(1) Homopolymerization or copolymerization of polymerizable monomers having basic group:

The desired resin can be synthesized by subjecting a polymerizable monomer containing a basic group (e.g., a vinyl compound, an acrylate compound, a methacrylate compound, an acrylamide compound, a methacrylamide compound, a styrene compound, an α-methylstyrene compound) to homopolymerization or copolymerization with another polymerizable monomer in the presence of an appropriate solvent and catalyst.

Specific examples of the polymerizable monomer containing a basic group include acrylate or methacrylate compounds such as 2-dimethylaminoethyl (meth)acrylate and 3-dimethylaminopropyl (meth)acrylate, acrylamide or methacrylamide compounds such as 2-dimethylamino (meth) acrylamide and 4-dimethylaminophenyl (meth)acrylamide, vinyl compounds such as 4-vinylpyridine, 2-vinylpyridine, 2-vinylimidazole, N-vinylindole, N-vinylcarbazol and 4-vinylquinoline, and styrene compounds such as 4-dimethylaminostyrene, 4-phenylaminostyrene, dimethylaminomethylstyrene and 4-dimethylamino-α-methylstyrene. However, the present invention should not be construed as being limited to these compounds.

Examples of another polymerizable monomers which can be copolymerized with the foregoing polymerizable monomer containing a basic group (i.e., copolymerizable monomer) include a compound having one addition-polymerizable unsaturated bond selected from the group consisting of acrylates, acrylamides, methacrylates, methacrylamides, allyl compounds, vinylethers, vinylesters, styrenes and crotonates. Specific examples of the copolymerizable monomers include acrylates such as alkyl (preferably having 1 to 10 carbon atoms) acrylate (e.g., methyl acrylate, ethyl acrylate, propyl acrylate, butyl acrylate, amyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate, tetrahydrofurfuryl acrylate) and aryl acrylate (e.g., phenyl acrylate); methacrylates such as alkyl (preferably having 1 to 10 carbon atoms) methacrylate (e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate, tetrahydrofurfuryl methacrylate) and aryl methacrylate (e.g., phenyl methacrylate, cresyl methacrylate, naphtyl methacrylate); acrylamides such as acrylamide, N-alkylacrylamide (the alkyl group is preferably a $C_{1-10}$ alkyl group such as methyl, ethyl, propyl, butyl, t-butyl, heptyl, octyl, cyclohexyl, benzyl, hydroxyethyl and benzyl), N-arylacrylamide (examples of the aryl group include phenyl, tollyl, nitrophenyl, naphthyl, cyanophenyl, and hydroxyphenyl), N,N-dialkylacrylamide (the alkyl group is preferably a $C_{1-10}$ alkyl group such as methyl, ethyl, butyl, isobutyl, ethylhexyl and cyclohexyl), N,N-arylacrylamide (examples of the aryl group include phenyl), N-methyl-N-phenylacrylamide, N-hydroxyethyl-N-methylacrylamide and N-2-acetamidoethyl-N-acetylacrylamide; methacrylamides such as methacrylamide, N-alkyl methacrylamide (the alkyl group is preferably a $C_{1-10}$ alkyl group such as methyl, ethyl, t-butyl, ethylhexyl, hydroxyethyl and cyclohexyl), N-aryl methacrylamide (examples of the aryl group include phenyl, hydroxyphenyl, and carboxyphenyl), N,N-dialkyl methacrylamide (examples of the alkyl group include ethyl, propyl, and butyl), N,N-diaryl methacrylamide (examples of the aryl group include phenyl), N-hydroxyethyl-N-methyl methacrylamide, N-methyl-N-phenyl methacrylamide and N-ethyl-N-phenyl methacrylamide; allyl compounds such as allyl ester (e.g., allyl acetate, allyl caproate, allyl caprinate, allyl laurate, allyl palmitate, allyl stearate, allyl benzoate, allyl acetoacetate, allyl lactate) and allyloxy ethanol; vinyl ethers such as alkyl vinyl ether (e.g., hexyl vinyl ether, octyl vinyl ether, decyl vinyl ether, ethyl hexyl vinyl ether, methoxy ethyl vinyl ether, ethoxy ethyl vinyl ether, chloroethyl vinyl ether, 1-methyl-2,2-dimethylpropyl vinyl ether, 2-ethyl butyl vinyl ether, hydroxyethyl vinyl ether, diethylene glycol vinyl ether, dimethylamino ethyl vinyl ether, diethylamino ethyl vinyl ether, butylamino ethyl vinyl ether, benzyl vinyl ether, tetrahydrofurfuryl vinyl ether) and vinyl aryl ether (e.g., vinyl phenyl ether, vinyl tollyl ether, vinyl chlorophenyl ether, vinyl-2,4-dichlorophenyl ether, vinyl naphthyl ether, vinyl anthranyl ether); vinyl esters such as vinyl butyrate, vinyl isobutyrate, vinyl trimethyl acetate, vinyl diethyl acetate, vinyl valerate, vinyl caproate, vinyl chloroacetate, vinyl dichloroacetate, vinyl methoxy acetate, vinyl butoxy acetate, vinyl phenyl acetate, vinyl acetoacetate, vinyl lactate, vinyl-β-phenyl butyrate, vinyl cyclohexyl carboxylate, vinyl benzoate, vinyl salicylate, vinyl chlorobenzate, vinyl tetrachlorobenzoate and vinyl naphthoate; styrenes such as styrene, alkyl styrene (e.g., methyl styrene, dimethyl styrene, trimethyl styrene, ethyl styrene, diethyl styrene, isopropyl styrene, butyl styrene, hexyl styrene, cyclohexyl styrene, decyl styrene, benzyl styrene, chloromethyl styrene, trifluoromethyl styrene, ethoxymethyl styrene, acetoxymethyl styrene), alkoxy styrene (e.g., methoxy styrene, 4-t-butoxy styrene, 4-methoxy-3-methyl styrene, dimethoxy styrene), halogen styrene (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, 4-fluoro-3-trifluoromethylstyrene), 4-acetoxystyrene, 4-hydroxystyrene, 3-hydroxystyrene, 2-hydroxystyrene, 4-carboxystyrene and α-methylstyrene; crotonic esters such as alkyl crotonate (e.g., butyl crotonate, hexyl crotonate, glycerin monocrotonate); dialkyl itaconates (e.g., dimethyl itaconate, diethyl itaconate, dibutyl itaconate); dialkyl maleates or fumarates (e.g., dimethyl maleate, dibutyl fumarate); acrylic acid; methacrylic acid; maleimide; acrylonitrile; and methacrylonitrile. In addition, another copolymerizable addition-polymerizable unsaturated compounds may also be used.

These copolymerizable monomers may be used singly or in combination of two or more of them.

The content of the monomer component containing a basic group in the copolymer is preferably from 3 to 80 mol more preferably from 5 to 50 mol %, particularly from 5 to 30 mol %.

In case of the copolymer, it is preferred that the copolymerizable monomers are appropriately selected in such a manner that an alkali-soluble group such as phenolic hydroxyl group and carboxyl group is introduced in the copolymer to retain a good developability by an alkali developer.

(2) Polycondensation of aromatic compound containing basic group with aldehyde or ketone compound or polycondensation of phenolic compound with aldehyde containing basic group:

The resin containing a basic group and having a weight-average molecular weight of 2,000 or more to be used in the present invention can be synthesized by the polycondensation of an aromatic compound containing a basic group with an aldehyde or ketone compound, preferably by the copolycondensation thereof further with a phenolic compound, or by the polycondensation of a phenolic compound with an aldehyde containing a basic group, preferably by the copolycondensation thereof further with another aldehyde compound.

The aromatic compound containing a basic group may be a benzene compound containing a basic group or a substituted benzene compound containing a basic group. Specific examples of the aromatic compound containing a basic group include aniline, N-methylaniline, N,N-dimethylaniline, N,N-diethylaniline, N,N-dimethylaminophenol, N,N-dimethyltoluidine, N,N-dimethylanisidine, N-phenylaniline, and pyrrolidylbenzene.

Examples of the aldehyde or ketone compound to be used in the present invention include formaldehyde, paraformaldehyde, acetaldehyde, propionaldehyde, benzaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, chloroacetaldehyde, and acetal compounds thereof (e.g., chloroacetaldehydediethylacetal), acetone, methyl ethyl ketone, and cyclohexanone. Among these aldehyde or ketone compounds, formaldehyde is preferred.

These aldehydes or ketones may be used singly or in combination of two or more of them.

Examples of the phenol compound to be used in the present invention include phenol, cresols such as m-cresol, p-cresol and o-cresol, xylenols such as 2,5-xylenol, 3,5-xylenol, 3,4-xylenol and 2,3-xylenol, alkylphenols such as m-ethylphenol, p-ethylphenol, o-ethylphenol, p-t-butylphenol, p-octylphenol and 2,3,5-trimethylphenol, alkoxyphenols such as p-methoxyphenol, m-methoxyphenol, 3,5-dimethoxyphenol, 2-methoxy-4-methylphenol, m-ethoxyphenol, p-ethoxyphenol, m-propoxyphenol, p-propoxyphenol, m-butoxyphenol and p-butoxyphenol, bisalkylphenols such as 2-methyl-4-isopropylphenol, and hydroxyaromatic compounds such as m-chlorophenol, p-chlorophenol, o-chlorophenol, dihydroxybiphenyl, bisphenol A, phenylphenol, resorcinol and naphthol. These phenol compounds may be used singly or in combination of two or more of them. However, the present invention should not be construed as being limited thereto.

The foregoing aldehyde containing a basic group may be an aromatic aldehyde containing a basic group. Specific examples of the aromatic aldehyde containing a basic group include 4-(N,N-dimethylamino)benzaldehyde, 4-(N,N-diethylamino)benzaldehyde, 4-(N,N-dimethylamino)-2-hydroxybenzaldehyde, 4-(N,N-dimethylamino)-3-hydroxybenzaldehyde, and 4-(N,N-dimethylamino) naphthylaldehyde. However, the present invention should not be construed as being limited to these compounds.

The foregoing polycondensation or copolycondensation may be effected under heating in the presence of an acidic catalyst. Examples of the acidic catalyst include hydrochloric acid, sulfuric acid, formic acid, acetic acid, oxalic acid and the like. In the copolycondensate, the content of the aromatic compound containing a basic group in the condensate with an aldehyde or ketone compound or the content of the aldehyde containing a basic group in the condensate of the aldehyde with a phenolic compound is preferably from 3 to 60 mol %, more preferably from 5 to 40 mol %, particularly from 5 to 20 mol %.

(3) Deoxidation condensation of phenolic hydroxyl group- or carboxyl group-containing resin with basic group-containing halide or tosyl compound:

The resin containing a basic group and having a weight-average molecular weight of 2,000 or more may also be synthesized by the deoxidation condensation of a phenolic hydroxyl group- or carboxyl group-containing resin with a basic group-containing halide or tosyl compound. The phenolic hydroxyl group- or carboxyl group-containing resin may be the alkali-soluble resin to be used in the present invention as described later. The foregoing basic group-containing halide or tosyl compound may be a basic group-containing alkyl chloride, alkyl bromide or alkyl tosylate. Specific examples of the basic group-containing halide or tosyl compound include N,N-dimethylaminopropyl chloride, N,N-dimethylaminopropyl bromide, N,N- dimethylaminoethyl tosylate, N,N-dimethylaminobenzyl chloride, N,N-diethylaminobenzyl chloride, 4-pyridylmethyl chloride, 2-pyridylmethyl chloride, and 2-(N,N-dimethylaminophenoxy)-ethyl chloride. However, the present invention should not be construed as being limited to these compounds.

The amount of the basic group-containing halide or tosyl compound to be introduced into the phenolic hydroxyl group- or carboxyl group-containing resin is preferably from 3 to 60 mol %, more preferably from 5 to 40 mol %, particularly from 5 to 20 mol %.

The weight-average molecular weight of the resin containing a basic group according to the present invention synthesized by any of the foregoing methods (1) to (3) is 2,000 or more, preferably from 3,000 to 200,000, more preferably from 3,000 to 50,000, as calculated in terms of polystyrene as standard.

The amount of the foregoing basic group-containing resin to be incorporated in the photosensitive composition (excluding the coating solvent) may be properly determined based on the amount of an acid-generating compound as described later. Preferably, it is determined so as to give the molar ratio of the acid-generating compound to the basic group in the basic group-containing resin of from 1/2 to 100/1, more preferably from 1/2 to 50/1, further preferably from 1/1 to 20/1, furthermore preferably from 2/1 to 10/1.

Specific examples of these basic group-containing resins will be listed below, but the present invention should not be construed as being limited thereto.

In the following formulae, m/n is from 60/40 to 80/20 by mol, and m/n/l is from 50/30/20 to 70/10/20 by mol.

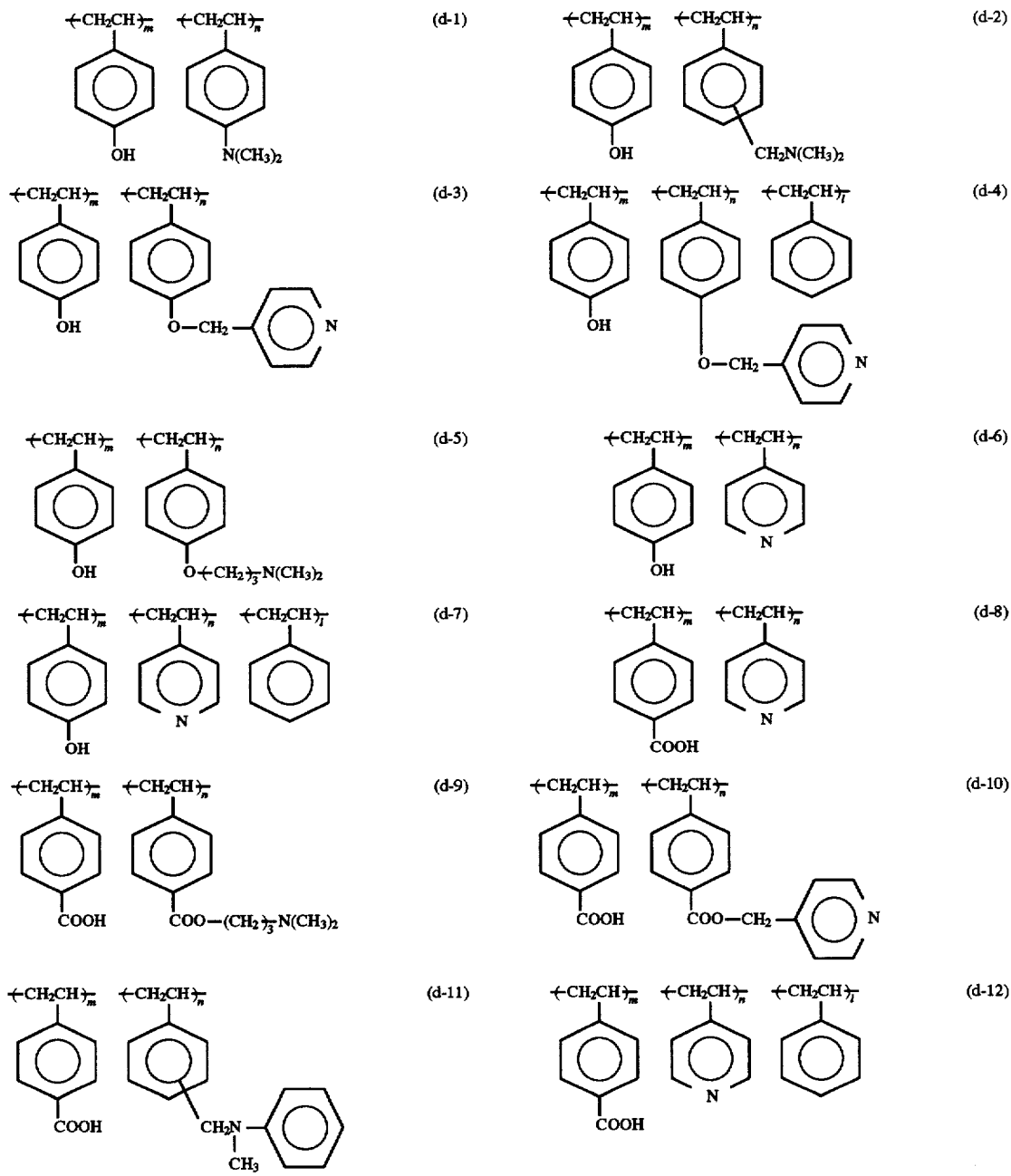

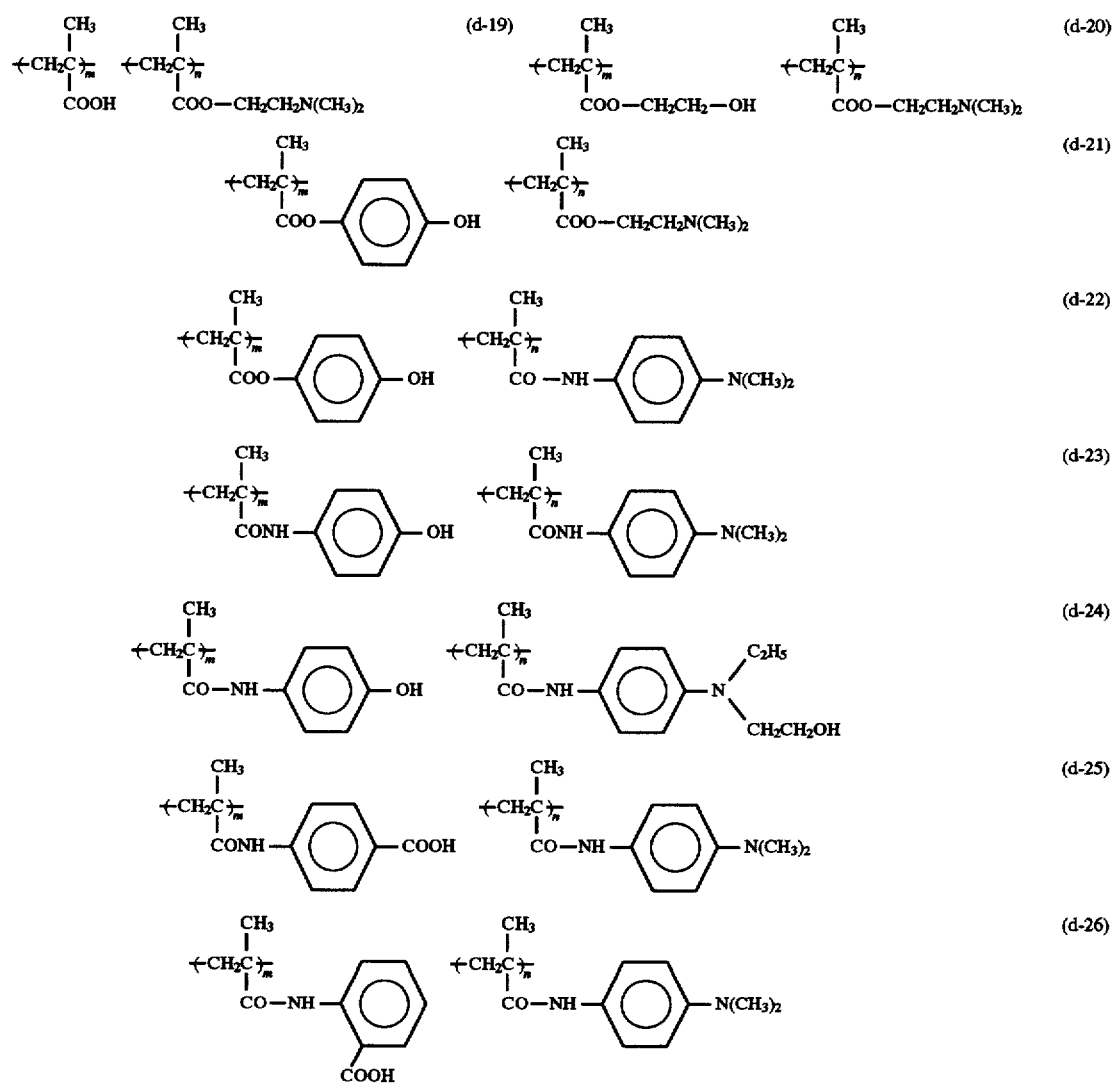

-continued

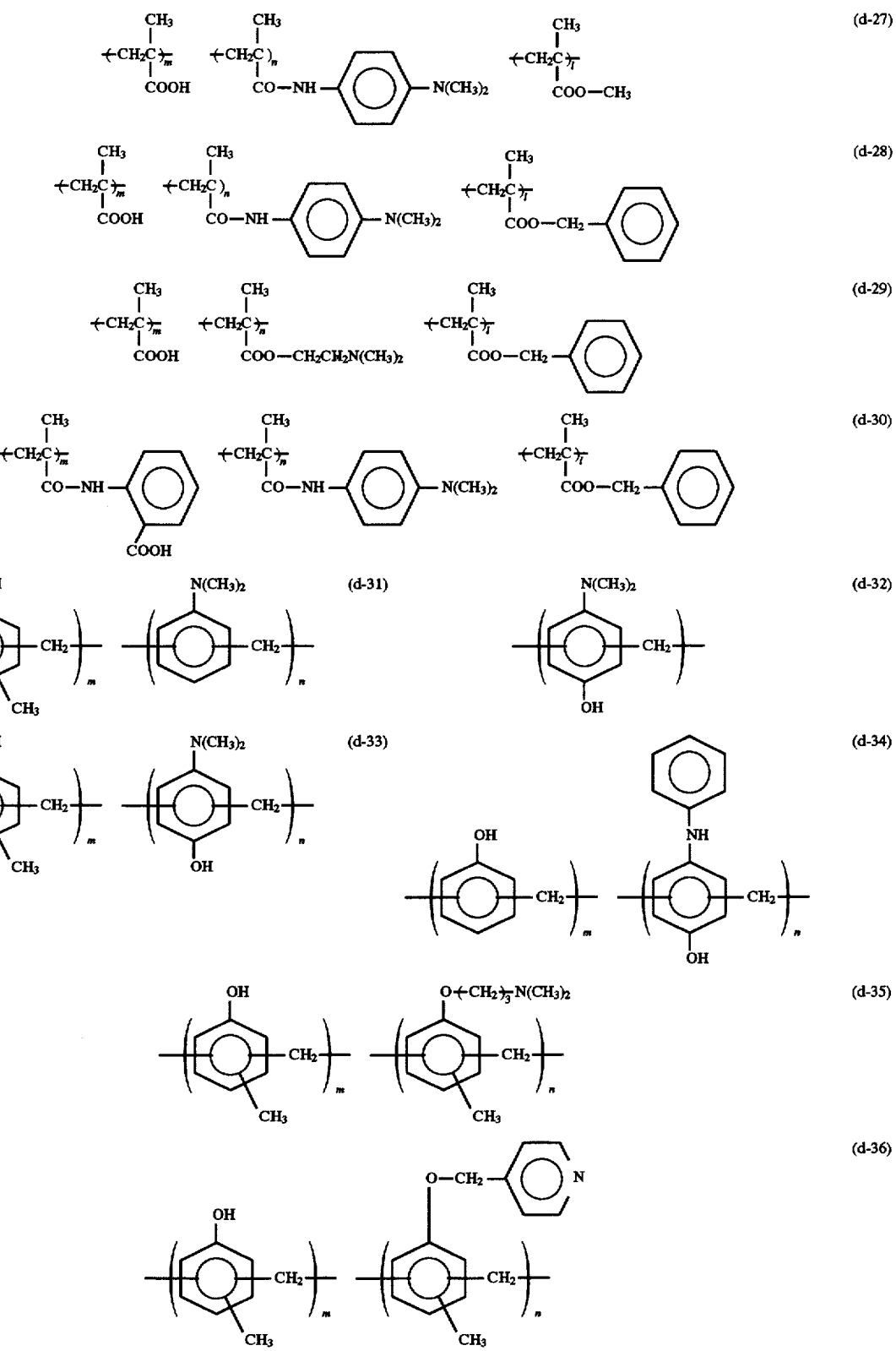

(II) Resin which is insoluble in water but soluble in an alkaline aqueous solution (hereinafter occasionally referred to as "alkali-soluble resin") (component (a) of the present invention):

Examples of the alkali-soluble resin to be used in the present invention include novolak resin, hydrogenated novolak resin, acetone-pyrogallol resin, o-polyhydroxystyrene, m-polyhydroxystyrene, p-polyhydroxystyrene, hydrogenated polyhydroxystyrene, halogen-substituted polyhydroxystyrene, alkyl-substituted polyhydroxystyrene, hydroxystyrene-N-substituted maleimide copolymer, o/p-hydroxystyrene copolymer, m/p-hydroxystyrene copolymer, plyhydroxystyrene partial o-alkylation product on its hydroxyl group (e.g., 5 to 30 mol % o-methylation product, o-(1-methoxy) ethylation product, o-(1-ethoxy)ethylation product, o-2-tetrahydropyranylation product, o-(t-butoxycarbonyl) methylation product), polyhydroxystryrene partial o-acylation product on its hydroxyl group (e.g., 5 to 30 mol % o-acetylation product, o-(t-butoxy)carbonylation product), styrene-maleic anhydride copolymer, styrenehydroxystyrene copolymer, α-methylstyrene-hydroxystyrene copolymer, carboxyl group-containing methacrylic resin, and derivatives thereof. However, the present invention should not be construed as being limited to these compounds.

Particularly preferred among these alkali-soluble resins are novolak resin, o-polyhydroxystyrene, m-polyhydroxystyrene, p-polyhydroxystyrene, copolymers thereof, alkyl-substituted polyhydroxystyrene, polyhydroxystyrene partial o-alkylation product, polyhydroxystyrene partial o-acylation product, styrenehydroxystyrene copolymer, and α-methylstyrene-hydroxystyrene copolymer. The foregoing novolak resin can be obtained by addition condensation of prescribed monomers as main components with an aldehyde in the presence of an acidic catalyst.

Examples of the foregoing prescribed monomers to be used in the present invention include cresols such as phenol, m-cresol, p-cresol and o-cresol; xylenols such as 2,5-xylenol, 3,5-xylenol, 3,4-xylenol and 2,3-xylenol; alkylphenols such as m-ethylphenol, p-ethylphenol, o-ethylphenol, p-t-butylphenol, p-octylphenol and 2,3,5-trimethylphenol; alkoxyphenols such as p-methoxyphenol, m-methoxyphenol, 3,5-dimethoxyphenol, 2-methoxy-4-methylphenol, m-ethoxyphenol, p-ethoxyphenol, m-propoxyphenol, p-propoxyphenol, m-butoxyphenol and p-butoxyphenol; bisalkylphenols such as 2-methyl-4-isopropylphenol; and hydroxyaromatic compounds such as m-chlorophenol, p-chlorophenol, o-chlorophenol, dihydroxybiphenyl, bisphenol A, phenylphenol, resorcinol and naphthol. These monomers may be used singly or in combination of two or more of them. However, the present invention should not be construed as being limited to these compounds.

Examples of the aldehydes to be used in the present invention include formaldehyde, paraformaldehyde, acetaldehyde, propionaldehyde, benzaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, chloroacetaldehyde, and actal compounds thereof (e.g., chloroacetaldehydediethylacetal). Particularly preferred among these aldehydes is formaldehyde.

These aldehydes may be used singly or in combination of two or more of them. Examples of the acidic catalyst include hydrochloric acid, sulfuric acid, formic acid, acetic acid, oxalic acid or the like.

The weight-average molecular weight of the novolak resin thus obtained is preferably from 1,000 to 30,000. If the weight-average molecular weight of the novolak resin falls below 1,000, the unexposed area shows a great thickness reduction after development. On the contrary, if the weight-average molecular weight of the novolak resin exceeds 30,000, the development speed is reduced. A particularly preferred range of the weight-average molecular weight of the novolak resin is from 2,000 to 20,000.

The weight-average molecular weight of the foregoing polyhydroxystyrene other than novolak resin, or derivative thereof is normally 2,000 or more, preferably from 5,000 to 200,000, more preferably from 10,000 to 100,000. In view of improvement in the heat resistance of the resist layer, it is preferably 25,000 or more.

The weight-average molecular weight as used herein is determined by gel permeation chromatography as calculated in terms of polystyrene.

Two or more of these alkali-soluble resins of the present invention may be used in admixture. The amount of the alkali-soluble resin to be used is normally from 50 to 97% by weight, preferably from 60 to 90% by weight, based on the total weight of the photosensitive composition (excluding the solvent).

(III) Compound which generates an acid upon irradiation with active light or radiation (component (b) or (1)of the present invention):

The compound which generates an acid upon irradiation with active light or radiation to be used in the present invention may be selected from a photocationic polymerization photoinitiator, a photoradical polymerization photoinitiator, a dye photodecolorizer, a photodiscolorizer, a known compound for microresist which generates an acid upon irradiation with light, or mixture thereof.

Specific examples of these compounds include onium salts such as diazonium salts as disclosed in S. I. Schlensinger, *Photogr. Sci. Eng.*, 18, 387(1974), and T. S. Bal et al., *Polymer*, 21, 423 (1980), ammonium salts as disclosed in U.S. Pat. Nos. 4,069,055, 4,069,056, and Re 27,992, and JP-A-4-365049, phosphonium salts as disclosed in D. C. Necker et al., *Macromolecules*, 17, 2468 (1984), C. S. Wen et al., *Teh, Proc. Conf. Rad. Curing*, ASIA, p 478, Tokyo, Oct. (1988), and U.S. Pat. Nos. 4,069,055 and 4,069,056, iodonium salts as disclosed in J. V. Crivello et al., *Macromolecules*, 10 (6), 1307 (1977), *Chem. & Eng. News*, Nov. 28, p 31 (1988), European Patent 104,143, U.S. Pat. Nos. 339,049 and 410,201, JP-A-2-150848, and JP-A-2-296514, sulfonium salts as disclosed in J. V. Crivello et al., *Polymer J.*, 17, 73 (1985), J. V. Crivello et al., *J. Org. Chem.*, 43, 3055 (1978), W. R. Watt et al., *J. Polymer Sci.*, Polymer Chem. Ed., 22, 1789 (1984), J. V. Crivello et al., *Polymer Bull.*, 14, 279 (1985), J. V. Crivello et al., *Macromolecules*, 14 (5), 1141 (1981), J. V. Crivello et al., *J. Polymer Sci.*, Polymer Chem. Ed., 17, 2877 (1979), European Patents 370,693, 3,902,114, 233,567, 297,443 and 297,442, U.S. Pat. Nos. 4,933,377, 161,811, 410,201, 339,049, 4,760,013 4,734,444 and 2,833,827, German Patents 2,904,626, 3,604, 580 and 3,604,581, selenonium salts as disclosed in J. V. Crivello et al., *Macromolecules*, 10 (6), 1307 (1977), and J. V. Crivello et al., *J. Polymer Sci.*, Polymer Chem. Ed., 17, 1047 (1979), and arsonium salts as disclosed in C. S. Wen et al., *Teh, Proc. Conf. Rad. Curing*, ASIA, p 478Tokyo, Oct (1988); organic halogen compounds as disclosed in U.S. Pat. No. 3,905,815, JP-B-46-4605, JP-A-48-36281, JP-A-55-32070, JP-A-60-239736, JP-A-61-169835, JP-A-61-169837, JP-A-62-58241, JP-A-62-212401, JP-A-63-70243, and JP-A-63-298339; organic metal/organic halides as disclosed in K. Meier et al., *J. Rad. Curing*, 13 (4), 26 (1986), T. P. Gill et al., *Inorg. Chem.*, 19, 3007 (1980), D. Astruc, *Acc. Chem. Res.*, 19 (12), 377 (1986), and JP-A-2-161445;

photo acid generators containing o-nitrobenzyl type protective group as disclosed in S. Hayase et al., *J. Polymer Sci.*, 25, 753 (1987), E. Reichmanis et al., *J. Polymer Sci.*, Polymer Chem. Ed., 23, 1 (1985), Q. Q. Zhu et al., *J. Photochem.*, 36, 85, 39, 317 (1987), B. Amit et al., *Tetrahedron Lett.*, (24) 2205 (1973), D. H. R. Barton et al., *J. Chem. Soc.*, 3571 (1965), P. M. Collins et al., *J. Chem. Soc.*, Perkin I, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al., *J. Imaging Technol.*, 11 (4), 191 (1985), H. M. Houlihan et al., *Macromolecules*, 21, 2001 (1988), P. M. Collins et al., *J. Chem. Soc.*, Chem. Commun., 532 (1972), S. Hayase et al., *Macromolecules*, 18, 1799 (1985), E. Reichmanis et al., *J. Electrochem. Soc.*, Solid State Sci, Technol., 130 (6), F. M. Houlihan et al., *Macromolecules*, 21, 2001 (1988), European Patents 0,290,750, 046,083, 156,535, 271,851 and 0,388, 343, U.S. Pat. Nos. 3,901,710, and 4,181,531, JP-A-60-198538, and JP-A-53-133022; compounds which undergo photodecomposition to generate sulfonic acid such as iminosulfonate as disclosed in M. Tunooka et al., *Polymer preprints*, Japan, 35 (8), G. Berner et al., *J. Rad. Curing*, 13 (4), W. J. Mijs et al, *Coating Technol.*, 55 (697), 45 (1983), Akzo, H. Adachi et al., *Polymer Preprints*, Japan, 37 (3), European Patents 0,199,672, 84,515, 199,672, 044,115 and 0,101,122, U.S. Pat. Nos. 618,564, 4,371,605 and 4,431, 774, JP-A-64-18143, JP-A-2-245756, and JP-A-4-365048, and disulfone compounds as disclosed in JP-A-61-166544.

Further, compounds comprising these acid-generating groups or compounds incorporated in its main or side chain may be used. Examples of these compounds are disclosed in M. E. Woodhouse et al., *J. Am. Chem. Soc.*, 104, 5586 (1982), S. P. Pappas et al., *J. Imaging Sci.*, 30 (5), 218 (1986), S. Kondo et al., *Makromol. Chem*, Rapid Commun., 9, 625 (1988), Y. Yamada et al., *Makromol. Chem.*, 152, 153, 163 (1972), J. V. Crivello et al., *J. Polymer Sci.*, Polymer Chem. Ed., 17, 3845 (1979), U.S. Pat. No. 3,849,137, German Patent 3,914,407, JP-A-63-26653, JP-A-55-164824, JP-A-63-163452, JP-A-62-153853, and JP-A-63-146029.

Moreover, compounds which generate an acid upon irradiation with light as disclosed in V. N. R. Pillai, *Synthesis.*, (1), 1 (1980), A. Abad et al., *Tetrahedron Lett.*, (47) 4555 (1971), D. H. R. Barton et al., *J. Chem. Soc.*, (C), 329 (1970), U.S. Pat. No. 3,779,778, and European Patent 126, 712 can be used.

Particularly useful examples of the foregoing compound which undergoes decomposition to generate an acid upon irradiation with an active light or radiation will be given below.

(1) Trihalomethyl group-substituted oxazoline derivatives represented by the following formula (PAG1) or trihalomethyl group-substituted s-triazine derivatives represented by the following formula (PAG2):

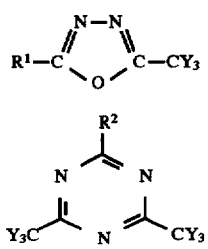

wherein R represents a substituted or unsubstituted aryl or alkenyl group; an $R^2$ represents a substituted or unsubstituted aryl, alkenyl or alkyl group or $—CY_3$ (wherein $Y_3$ represents a chlorine atom or bromine atom).

Preferably, R is a $C_{6-14}$ monocyclic or condensed-ring aryl group or a $C_{3-15}$ alkenyl group, and $R^2$ is a monocyclic or condensed-ring aryl group, a $C_{3-15}$ alkenyl group or a $C_{1-8}$ alkyl group. Preferred examples of the substituent include an alkyl group, a haloalkyl group, a cycloalkyl group, an aryl group, an alkoxy group, nitro group, carboxyl group, an alkoxycarbonyl group, hydroxyl group, mercapto group, a halogen atom, and an alkylthio group.

Specific examples of these compounds include the following compounds, but the present invention should not be construed as being limited thereto.

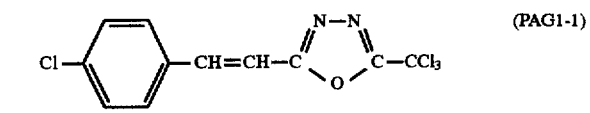

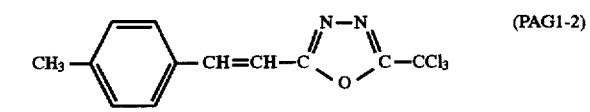

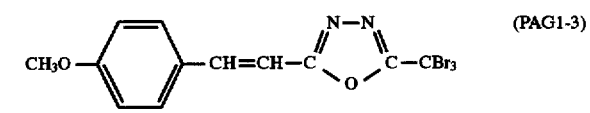

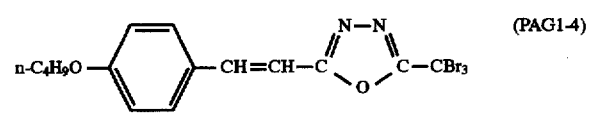

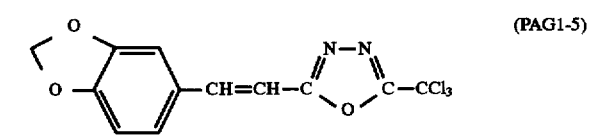

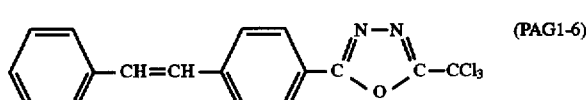

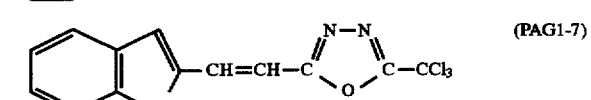

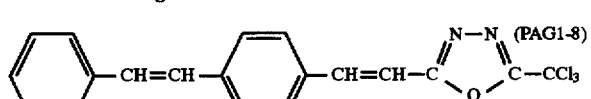

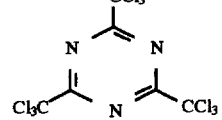

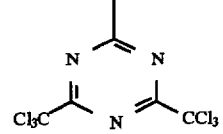

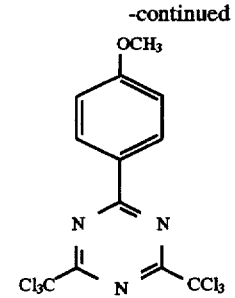 (PAG2-3)

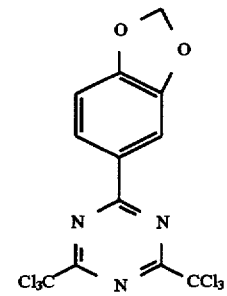 (PAG2-4)

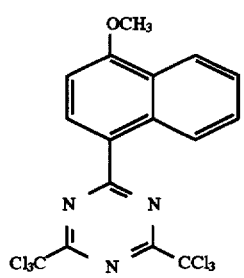 (PAG2-5)

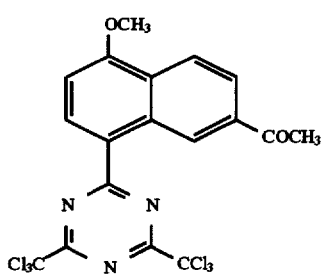 (PAG2-6)

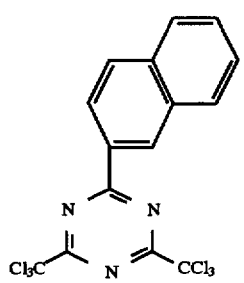 (PAG2-7)

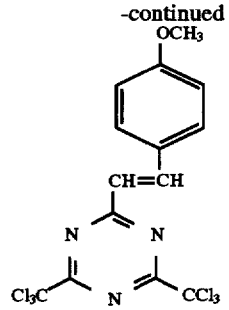 (PAG2-8)

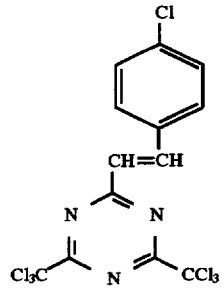 (PAG2-9)

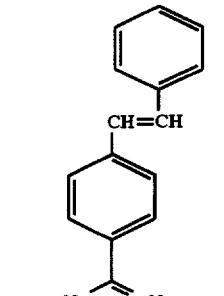 (PAG2-10)

(2) Iodonium salt represented by the following formula (PAG3) or sulfonium salt represented by the following formula (PAG4):

 (PAG3)

 (PAG4)

In the foregoing formulae, $Ar^1$ and $Ar^2$ each independently represents a substituted or unsubstituted aryl group. A preferred example of the aryl group includes a $C_{6-14}$ monocyclic or condensed-ring aryl group. Preferred examples of the substituent on the aryl group include an alkyl group, a haloalkyl group, a cycloalkyl group, an aryl group, an alkoxy group, nitro group, carboxyl group, an alkoxycarbonyl group, hydroxyl group, mercapto group, and a halogen atom.

$R^3$, $R^4$ and $R^5$ each independently represents a substituted or unsubstituted alkyl group or aryl group. Preferred examples of the substituted or unsubstituted alkyl group and aryl group include a $C_{6-14}$ aryl group, a $C_{1-8}$ aklyl group, and substituted derivatives thereof. Preferred examples of the substituent on the alkyl group include a $C_{1-8}$ alkoxy group, a $C_{1-8}$ aklyl group, nitro group, carboxyl group, hydroxyl group, and a halogen atom. Preferred examples of the substituent on the aryl group include a $C_{1-8}$ akloxy group, carboxyl group, an alkoxycarbonyl group, a $C_{1-8}$ haloalkyl group, a $C_{5-8}$ cycloalkyl group and a $C_{1-6}$ aklylthio group.

$Z^{31}$ represents an anion pair. Examples of such an anion pair include perfluoroalkanesulfonic acid anion such as $BF_4^-$, $AsF_6^-$, $PF_6^-$, $SbF_6^-$, $SiF_6^-$, $ClO_4^-$ and $CF_3SO_3^-$, condensed polynuclear aromatic sulfonic acid anion such as pentafluorobenzenesulfonic acid anion and naphthalene-1-sulfonic acid anion, anthraquinonesulfonic acid anion, and sulfonic acid-containing dye. However, the present invention should not be construed as being limited thereto.

Two of $R^3$, $R^4$ and $R^5$ and $Ar^1$ and $Ar^2$ may be connected to each other via its single bond or a substituent.

Specific examples of the foregoing compounds will be listed below, but the present invention should not be construed as being limited thereto.

(PAG3-1)

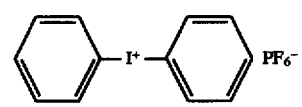
(PAG3-2)

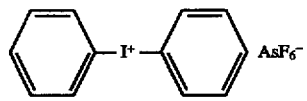
(PAG3-3)

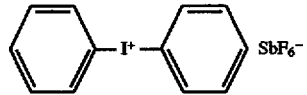
(PAG3-4)

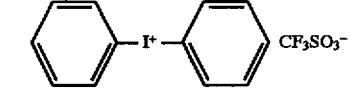
(PAG3-5)

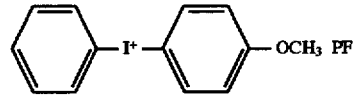
(PAG3-6)

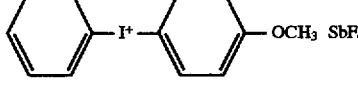
(PAG3-7)

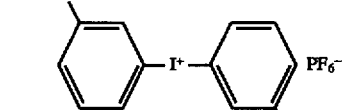
(PAG3-8)

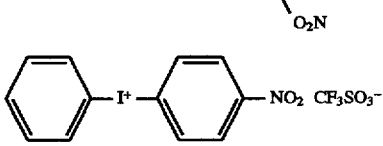
(PAG3-9)

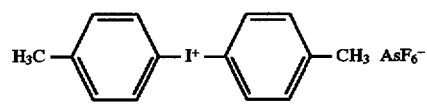
(PAG3-10)

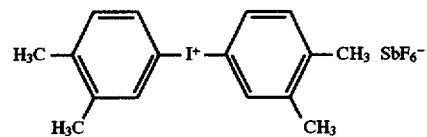
(PAG3-11)

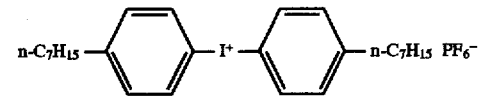
(PAG3-12)

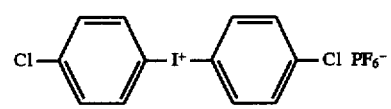
(PAG3-13)

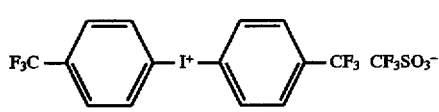
(PAG3-14)

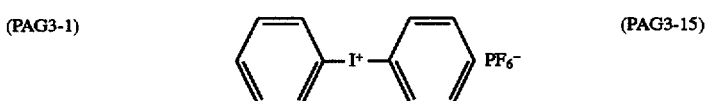
(PAG3-15)

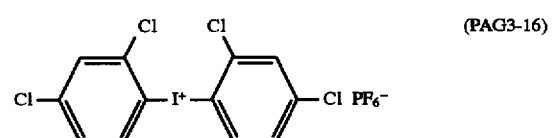
(PAG3-16)

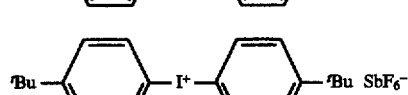
(PAG3-17)

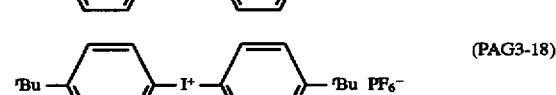
(PAG3-18)

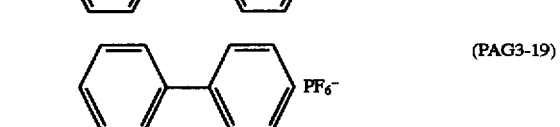
(PAG3-19)

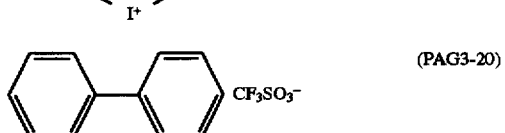
(PAG3-20)

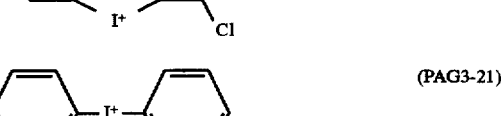
(PAG3-21)

-continued
(PAG3-22)
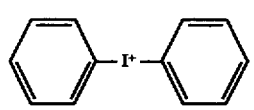 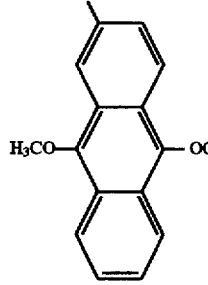
(PAG3-23)
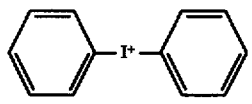 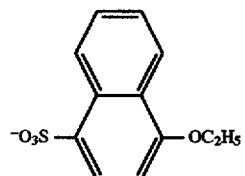
(PAG3-24)
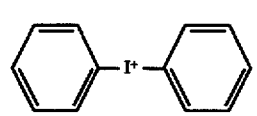 
(PAG3-25)
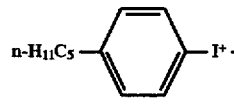
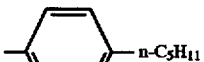
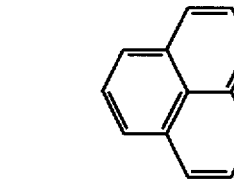
(PAG3-26)
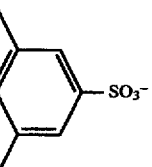
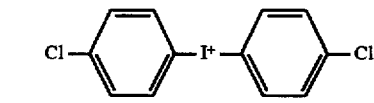
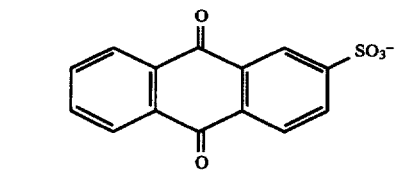
(PAG3-27)
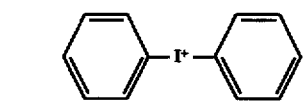
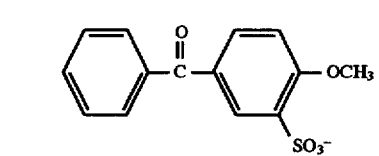
-continued
(PAG4-1)
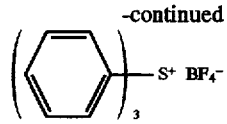
(PAG4-2)
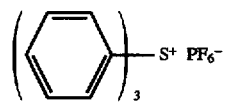
(PAG4-3)
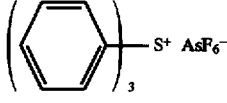
(PAG4-4)
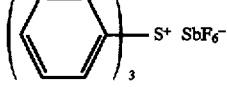
(PAG4-5)
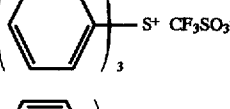
(PAG4-6)
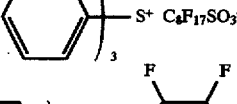
(PAG4-7)
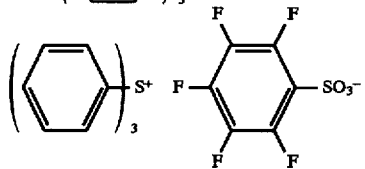
(PAG4-8)
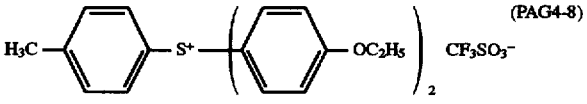
(PAG4-9)
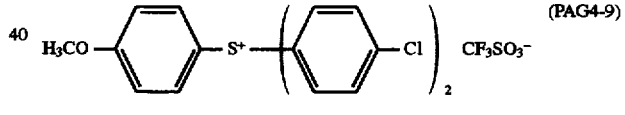
(PAG4-10)
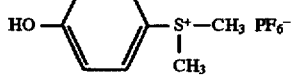
(PAG4-11)
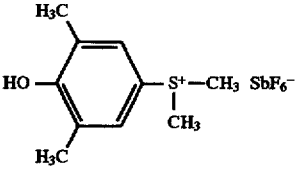
(PAG4-12)
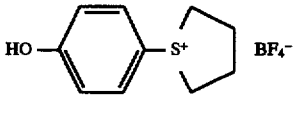
(PAG4-13)
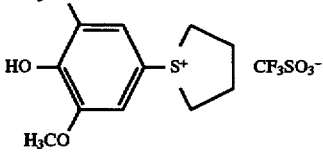

-continued
(PAG4-14) 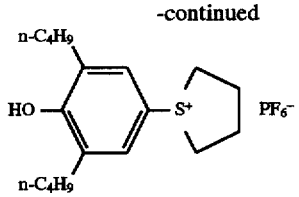
(PAG4-15) 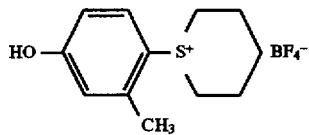
(PAG4-16) 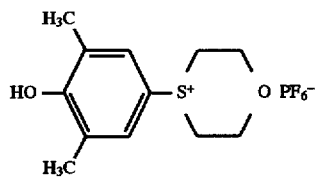
(PAG4-17) 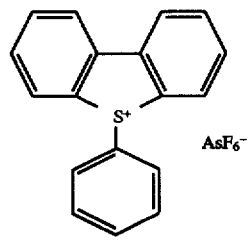
(PAG4-18) 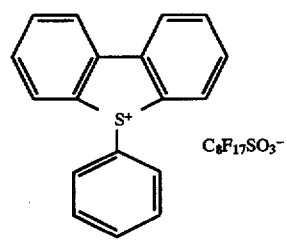
(PAG4-19) 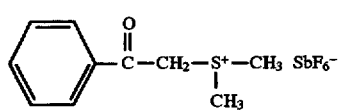
(PAG4-20) 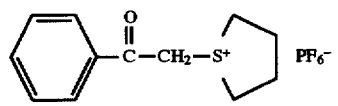
(PAG4-21) 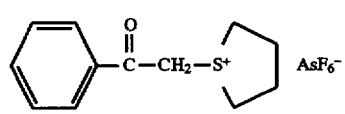
(PAG4-22) 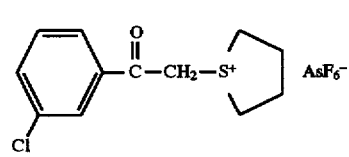
(PAG4-23) 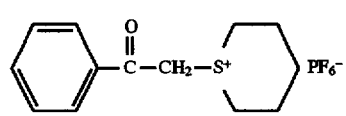
-continued
(PAG4-24) 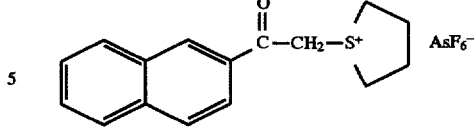
(PAG4-25) 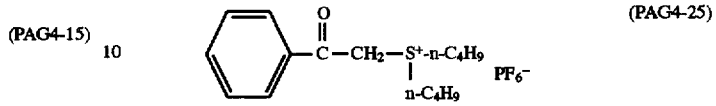
(PAG4-26) 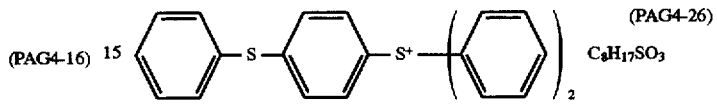
(PAG4-27) 
(PAG4-28) 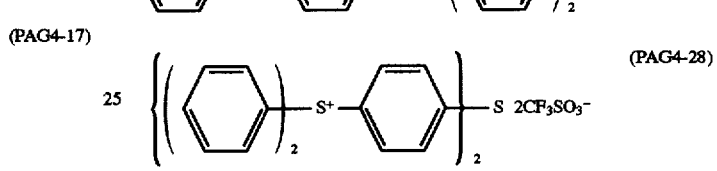
(PAG4-29) 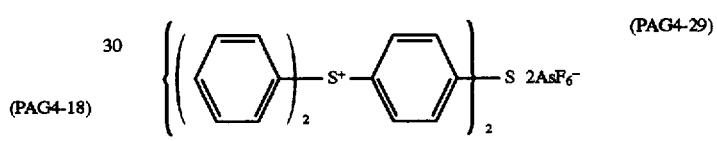
(PAG4-30) 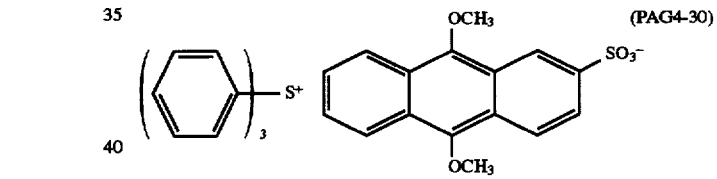
(PAG4-31) 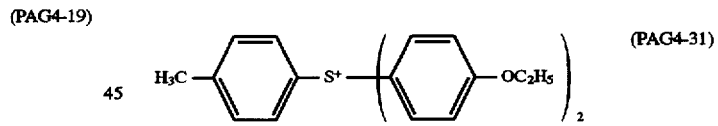
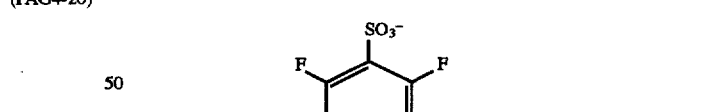
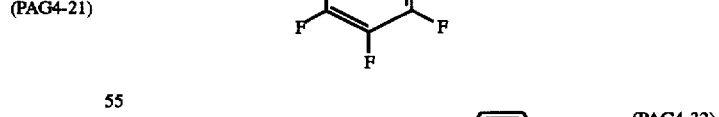
(PAG4-32) 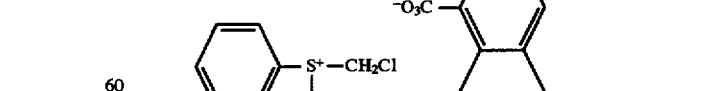

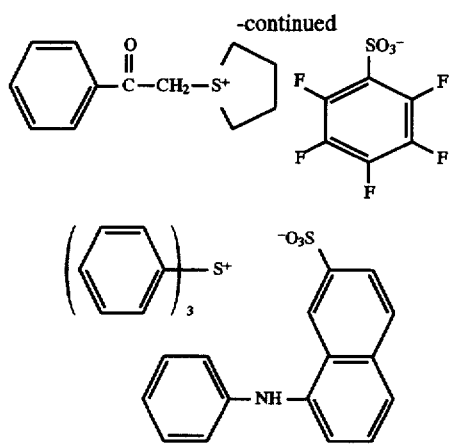
(PAG4-33)

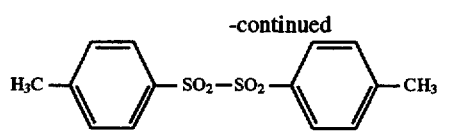
(PAG4-34)

The foregoing onium salts represented by formulae (PAG3) and (PAG4) are known. The synthesis of these onium salts can be accomplished by any suitable method as disclosed in J. W. Knapczyk et al., *J. Am. Chem. Soc.*, 91, 145 (1969), A. L. Maycok et al., *J. Org. Chem.*, 35, 2532, (1970), E. Goethas et al., *Bull. Soc. Chem. Belg.*, 73, 546, (1964), H. M. Leicester, *J. Ame. Chem. Soc.*, 51, 3587 (1962), J. V. Crivello et al., *J. Polym. Chem.*, Ed., 18, 2677 (1980), U.S. Pat. Nos. 2,807,648 and 4,247,473, and JP-A-53-101331.

(3) Disulfone derivative represented by the following formula (PAG5) or iminosulfonate derivative represented by the following formula (PAG6):

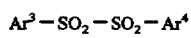
(PAG5)

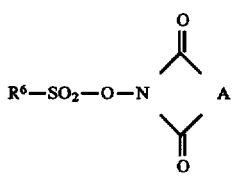
(PAG6)

wherein $Ar^3$ and $Ar^4$ each independently represents a substituted or unsubstituted aryl group; $R^6$ represents a substituted or unsubstituted alkyl or aryl group; and A represents a substituted or unsubstituted alkylene, alkenylene or arylene group. A preferred example of the aryl group includes a $C_{6-14}$ monocyclic or condensed-ring aryl group. Preferred examples of the substituent on the aryl group include an alkyl group, a haloalkyl group, a cycloalkyl group, an aryl group, an alkoxy group, nitro group, carboxyl group, an alkoxycarbonyl group, hydroxyl group, mercapto group, and a halogen atom. A preferred example of the alkylene includes a $C_{2-8}$ alkylene group, a preferred example of the alkenylene group includes a $C_{2-8}$ alkenylene group and a preferred example of the arylene group includes a $C_{6-14}$ arylene group.

Specific examples of the foregoing compound will be listed below, but the present invention should not be construed as being limited thereto.

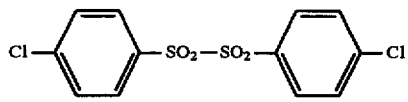
(PAG5-1)

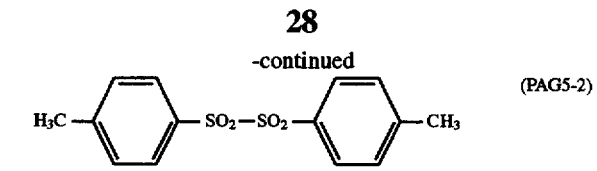
(PAG5-2)

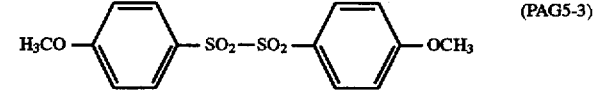
(PAG5-3)

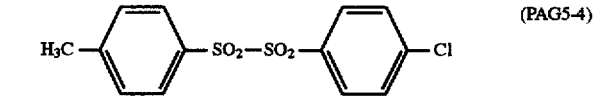
(PAG5-4)

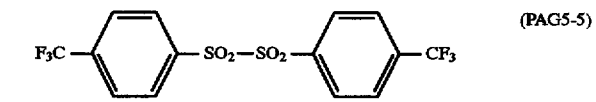
(PAG5-5)

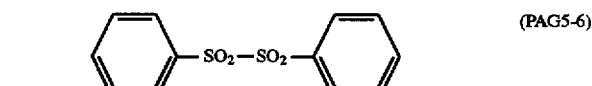
(PAG5-6)

PAG5-7)

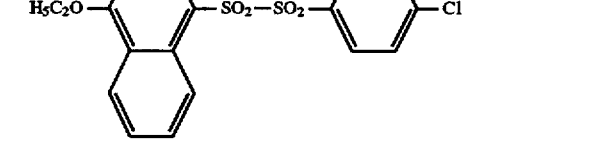
(PAG5-8)

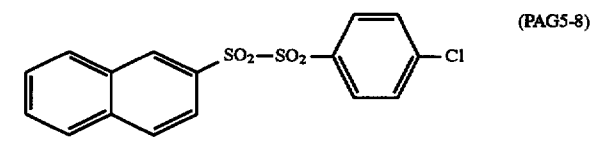
(PAG5-9)

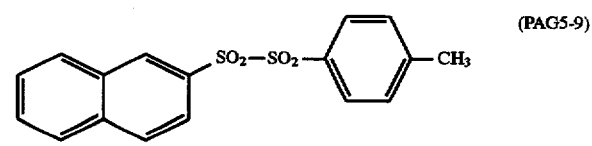
(PAG5-10)

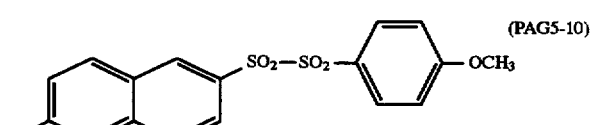
(PAG5-11)

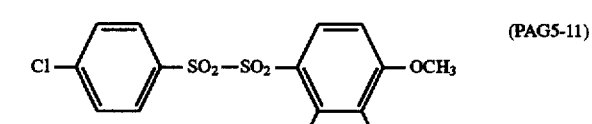
(PAG5-12)

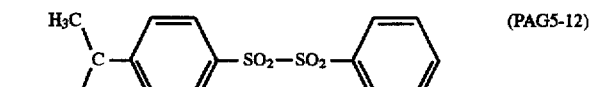

-continued

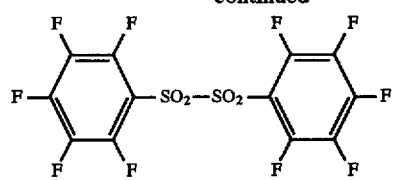 (PAG5-13)

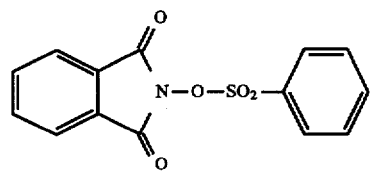 (PAG6-1)

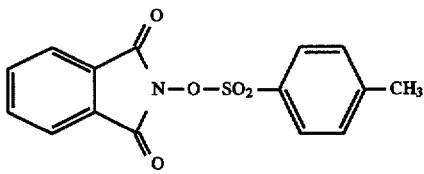 (PAG6-2)

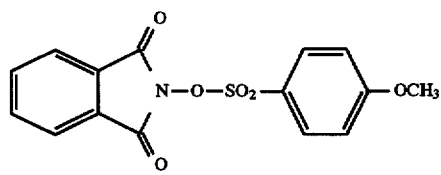 (PAG6-3)

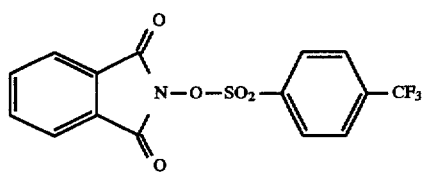 (PAG6-4)

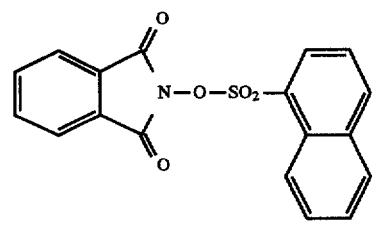 (PAG6-5)

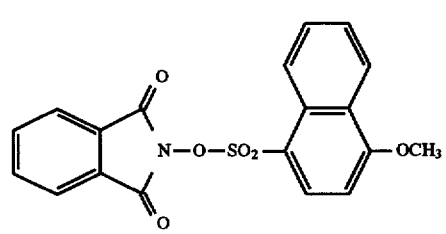 (PAG6-6)

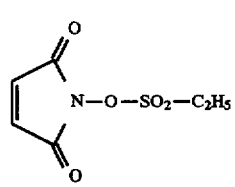 (PAG6-7)

-continued

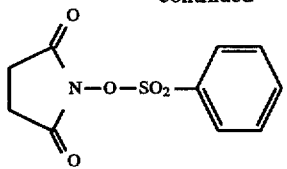 (PAG6-8)

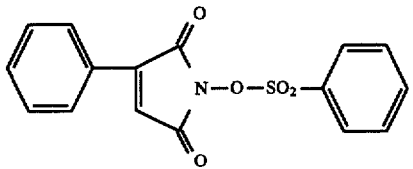 (PAG6-9)

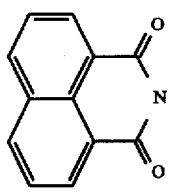 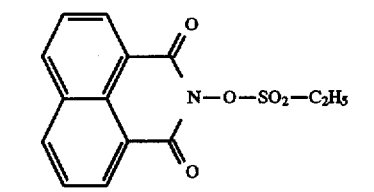 (PAG6-10)

(PAG6-11)

(PAG6-12)

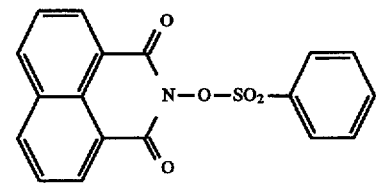 (PAG6-13)

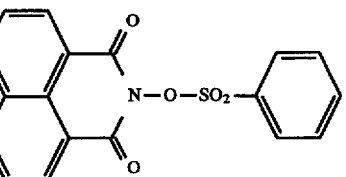 (PAG6-14)

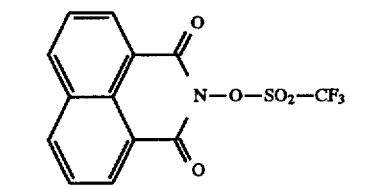 (PAG6-15)

The amount of the compound which undergoes decomposition upon irradiation with active light or radiation to generate an acid in the photosensitive composition of the present invention is normally from 0.001 to 40% by weight, preferably from 0.01 to 20% by weight, more preferably from 0.1 to 5% by weight, based on the total weight of the photosensitive composition (excluding the coating solvent).

(IV) Acid-decomposable dissolution-inhibitive compound (component (c) according to the present invention):

The acid-decomposable dissolution-inhibitive compound to be used in the present invention is a compound having in its structure at least two groups decomposable with an acid (acid-decomposable group), wherein the two acid-decomposable groups exist at a distance of at least 8 bonding atoms excluding the acid-decomposable groups themselves.

It is preferred that the acid-decomposable dissolution-inhibitive compound to be used in the present invention is a compound having at least two acid-decomposable groups in its structure, wherein the two acid-decomposable groups exist at a distance of at least 10, preferably 11, more preferably 12, bonding atoms excluding the acid-decomposable groups themselves, or a compound having at least three acid-decomposable groups in its structure, wherein the farthest two acid-decomposable groups among the at least three acid-decomposable groups exist at a distance of at least 9, preferably 10, more preferably 11, bonding atoms excluding the acid-decomposable groups themselves. The upper limit of the number of the bonding atoms between the farthest acid-decomposable groups is preferably 50, more preferably 30.

In the present invention, when the acid-decomposable dissolution-inhibitive compound has three or more, preferably four or more, acid-decomposable groups, or when the acid-decomposable dissolution-inhibiting compound has two acid-decomposable groups separated by a predetermined distance, its dissolution-inhibiting ability to the alkali-soluble resin is markedly enhanced.

The distance between the acid-decomposable groups as used herein means the number of bonding atoms exist between the acid-decomposable groups, provided that the acid-decomposable groups themselves are excluded. For example, in the case of the following reference formulae (1) and (2), the distance between the acid-decomposable groups is four bonding atoms. In the case of the following reference formula (3), it is 12 bonding atoms.

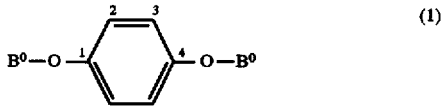
(1)

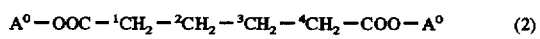
(2)

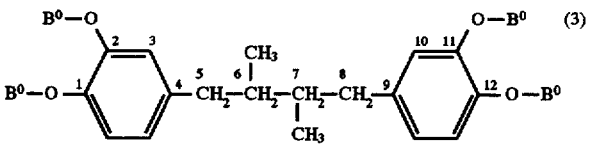
(3)

Acid-decomposable group: —COO—A°, —O—B°

The acid-decomposable dissolution-inhibitive compound according to the present invention may contain a plurality of acid-decomposable groups on one benzene ring. Preferably, the acid-decomposable dissolution-inhibitive compound according to the present invention is a compound composed of a skeleton having one acid-decomposable group on one benzene ring. The molecular weight of the acid-decomposable dissolution-inhibitive compound according to the present invention is 3,000 or less, preferably from 500 to 3,000, more preferably from 1,000 to 2,500.

In a preferred embodiment of the present invention, the acid-decomposable group, i.e., the group containing —COO—A° or —O—B° group may be a group represented by —R°—COO—A° or —Ar—O—B°.

In this instance, A° represents —C($R^{O1}$)($R^{O2}$)($R^{O3}$), —Si($R^{O1}$)($R^{O2}$)($R^{O3}$) or —C($R^{O4}$)($R^{O5}$)—O—$R^{O6}$ group, B° represents A° or —CO—O—A° group.

$R^{O1}$, $R^{O2}$, $R^{O3}$, $R^{O4}$ and $R^{O5}$ may be the same or different and each represents hydrogen atom, an alkyl group, a cycloalkyl group, an alkenyl group or an aryl group, and $R^{O6}$ represents an alkyl group or an aryl group, provided that at least two of $R^{O1}$ to $R^{O3}$ are groups other than hydrogen atom and two of $R^{O1}$ to $R^{O3}$ and $R^{O4}$ to $R^{O6}$ may be connected to each other to form a ring. R° represents an aliphatic or aromatic hydrocarbon group having a valency of 2 or more which may have a substituent. The group —Ar— represents a monocyclic or polycyclic aromatic group having a valency of 2 or more which may have a substituent.

Preferred examples of the foregoing alkyl group include a $C_{1-14}$ alkyl groups such as methyl group, ethyl group, propyl group, n-butyl group, sec-butyl group and t-butyl group. Preferred examples of the foregoing cycloalkyl group include a $C_{3-10}$ cycloalkyl groups such as cyclopropyl group, cyclobutyl group, cyclohexyl group and adamanthyl group. Preferred examples of the foregoing alkenyl groups include $C_{2-4}$ alkenyl group such as vinyl group, propenyl group, allyl group and butenyl group. Preferred examples of the foregoing aryl group include a $C_{6-14}$ aryl groups such as phenyl group, xylyl group, toluil group, cumenyl group, naphthyl group and anthracenyl group.

Examples of the substituent on these groups include hydroxyl group, a halogen atom (e.g., fluorine, chlorine, bromine, iodine); nitro group; cyano group; the foregoing alkyl group; an alkoxy group such as methoxy group, ethoxy group, hydroethoxy group, propoxy group, hydroxypropoxy group, n-butoxy group, isobutoxy group, sec-butoxy group and t-butoxy group; an alkoxycarbonyl group such as methoxycarbonyl group and ethoxycarbonyl group; an aralkyl group such as benzyl group, phenethyl group and cumyl group; an aralkyloxy group; an acyl group such as formyl group, acetyl group, butyryl group, benzoyl group, cyanamyl group and valeryl group; an acyloxy group such as butyryloxy group; the foregoing alkenyl group; an alkenyloxy group such as vinyloxy group, propenyloxy group, allyloxy group and butenyloxy group; the foregoing aryl group; an aryloxy group such as phenoxy group; and an aryloxycarbonyl group such as benzoyloxy group.

Preferred examples of the acid-decomposable group include a silylether group, a cumylester group, an acetal group, a tetrahydropyranylether group, an enolether group, an enolester group, a tertiary alkylether group, a tertiary alkylester group, and a tertiary alkylcarbonate group. More preferred among these groups are a tertiary alkylester group, the tertiary alkylcarbonate group, the cumylester group, and the tetrahydropyranylether group.

Preferred examples of the acid-decomposable dissolution-inhibitive compound include protected compounds obtained by bonding the foregoing group, i.e., —R°—COO—A° or B°, to a part of or the entire phenolic OH groups in a polyhydroxy compound described in JP-A-1-289946, JP-A-1-289947, JP-A-2-2560, JP-A-3-128959, JP-A-3-158855, JP-A-3-179353, JP-A-3-191351, JP-A-3-200251, JP-A-3-200252, JP-A-3-200253, JP-A-3-200254, JP-A-3-200255, JP-A-3-259149, JP-A-3-279958, JP-A-3-279959, JP-A-4-1650, JP-A-4-1651, JP-A-4-11260, JP-A-4-12356, JP-A-4-12357, JP-A-4-271349, JP-A-5-45869, JP-A-5-158233, JP-A-5-224409, JP-A-5-257275, JP-A-5-297581, JP-A-5-297583, JP-A-5-303197, JP-A-5-303200 and JP-A-5-341510.

Further preferred examples of the acid-decomposable dissolution-inhibitive compound include those obtained by using polyhydroxy compounds described in JP-A-1-289946, JP-A--128959, JP-A-3-158855, JP-A-3-179353, JP-A-3-200251, JP-A-3-200252, JP-A-3-200255, JP-A-3-259149, JP-A-3-279958, JP-A-4-1650, JP-A-4-11260, JP-A-4-

12356, JP-A-4-12357, JP-A-5-224409, JP-A-5-297581, JP-A-5-297583, JP-A-5-303197, JP-A-5-303200 and JP-A-5-341510.
Specific examples of the acid-decomposable dissolution-inhibitive compound include compounds represented by the following formulae [I] to [XVI]:
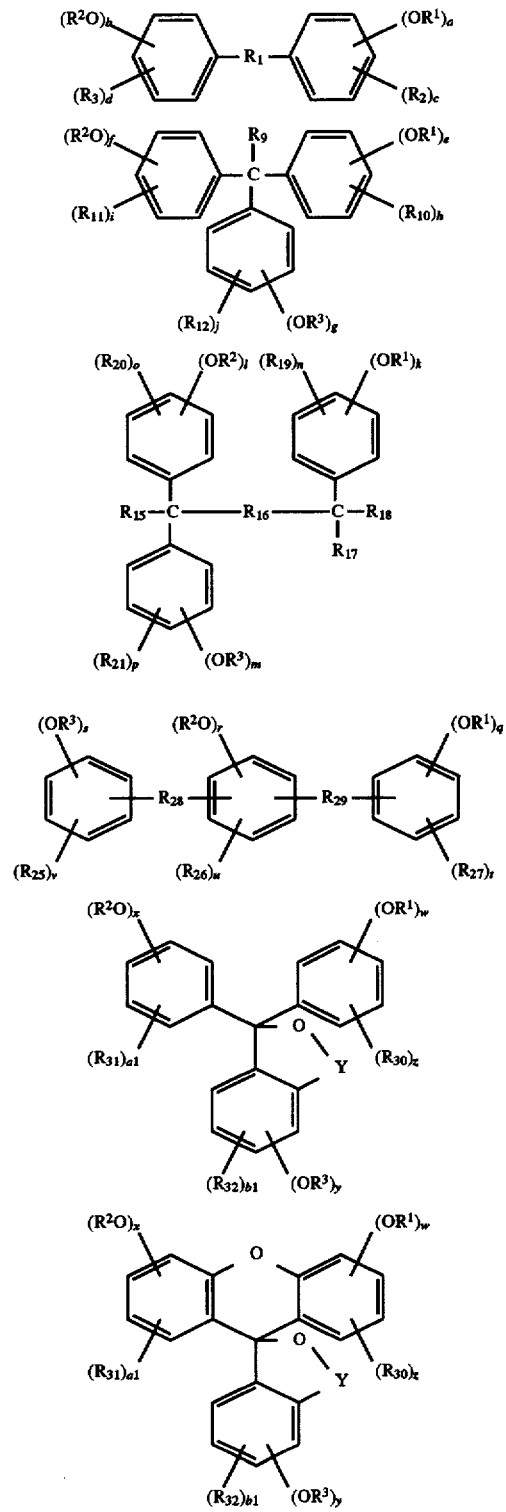
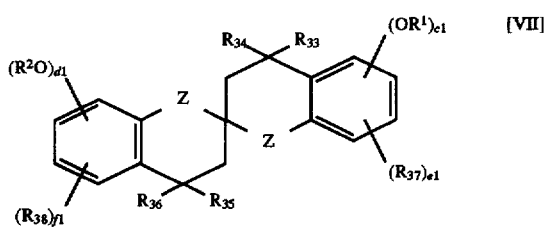
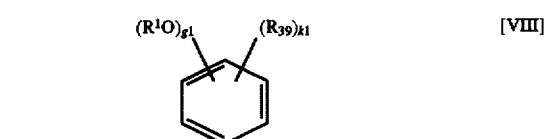
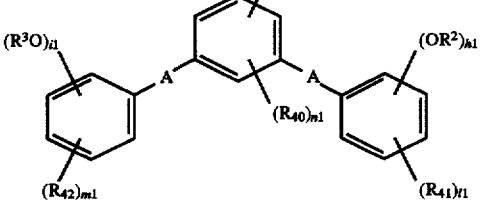
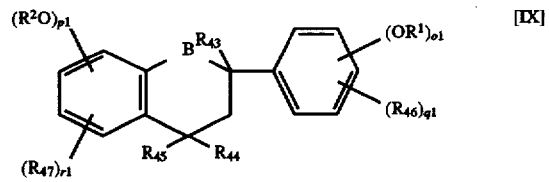
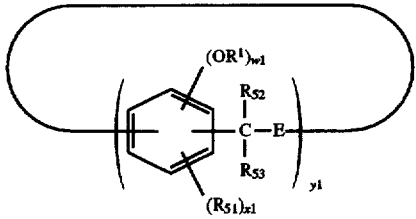

-continued

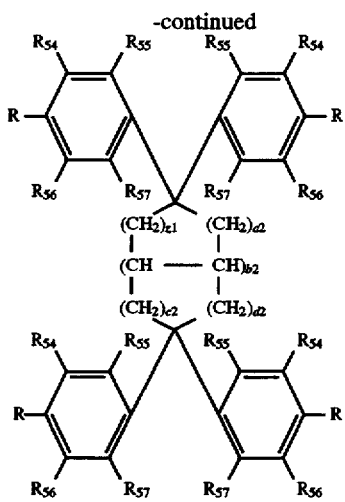
[XIII]

wherein:

$R^1$, $R^2$, $R^3$ and $R^4$ may be the same or different and each represents hydrogen atom, —$R^o$—COO—$A^o$ or $B^o$ group;

$R_l$ represents —CO—, —COO—, —NHCONH—, —NHCOO—, —●—, —S—, —SO—, —$SO_2$—, —$SO_3$— or

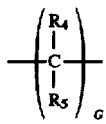

(in which G represents a number of 2 to 6, with the proviso that when G is 2, at least one of $R_4$ and $R_5$ is an alkyl group);

$R_4$ and $R_5$ may be the same or different and each represents hydrogen atom, an alkyl group, an alkoxy group, —OH, —COOH, —CN, a halogen atom, —$R_6$—$COOR_7$ or —$R_8$—OH ($R_6$ and $R_8$ each represents an alkylene group; $R_7$ represents hydrogen atom, an alkyl group, an aryl group or an aralkyl group);

$R_2$, $R_3$, $R_9$ to $R_{12}$, $R_{15}$, $R_{17}$ to $R_{21}$, $R_{25}$ to $R_{27}$, $R_{30}$ to $R_{32}$, $R_{37}$ to $R_{42}$, $R_{46}$ to $R_{49}$ and $R_{51}$ may be the same or different and each represents hydrogen atom, hydroxyl group, an alkyl group, an alkoxy group, an acyl group, an acyloxy group, an aryl group, an aryloxy group, an aralkyl group, an aralkyloxy group, a halogen atom, nitro group, carboxyl group, cyano group or —$N(R_{13})(R_{14})$ (in which $R_{13}$ and $R_{14}$ each represents hydrogen atom, an alkyl group or an aryl group);

$R_{16}$ represents a single bond, an alkylene group or

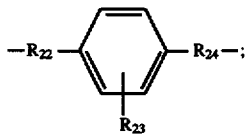

$R_{22}$ and $R_{24}$ may be the same or different and each represents a single bond, an alkylene group, —O—, —S—, —CO— or carboxyl group;

$R_{23}$ represents hydrogen atom, an alkyl group, an alkoxy group, an acyl group, an acyloxy group, an aryl group, nitro group, hydroxyl group, cyano group or carboxyl group, with the proviso that the hydrogen atom in the hydroxyl group may be substituted by t-butoxycarbonyl group;

$R_{28}$ and $R_{29}$ may be the same or different and each represents methylene group, a lower alkyl-substituted methylene group, a halomethylene group or a haloalkyl group, with the proviso that the term "lower alkyl group" as used herein means a "$C_{1-4}$ alkyl group";

$R_{33}$ to $R_{36}$ may be the same or different and each represents hydrogen atom or an alkyl group;

$R_{43}$ to $R_{45}$ may be the same or different and each represents hydrogen atom, an alkyl group, an alkoxy group, an acyl group or an acyloxy group;

$R_{50}$ represents hydrogen atom, t-butoxycarbonyl group or a group:

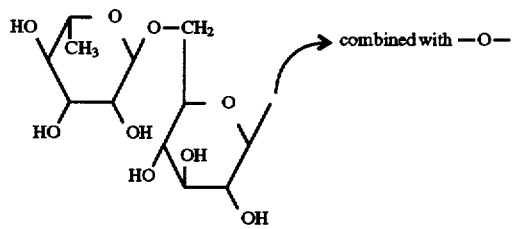

$R_{52}$ and $R_{53}$ may be the same or different and each represents hydrogen atom, a lower alkyl group, a lower haloalkyl group or an aryl group;

$R_{54}$ to $R_{57}$ may be the same or different and each represents hydrogen atom, hydroxyl group, a halogen atom, nitro group, cyano group, carbonyl group, an alkyl group, an alkoxy group, an alkoxycarbonyl group, an aralkyl group, an aralkyloxy group, an acyl group, an acyloxy group, an alkenyl group, an alkenyloxy group, an aryl group, an aryloxy group or an aryloxycarbonyl group, with the proviso that the four substituents represented by the same symbol may not be the same group;

Y represents —CO— or —$SO_2$—;

Z and B each represent a single bond or —O—;

A represents methylene group, a lower alkyl-substituted methylene group, a halomethylene group or an alkylene group having 2 or more carbon atoms;

E represents a single bond or oxymethylene group;

a to q, s, t, v, g1 to i1, k1 to m1, o1, s1 and u1 each represents an integer 0 to 5; r, u, w, x, y, z, a1 to f1, p1, r1, t1, and v1 to x1 each represents an integer of 0 to 4; j1, n1, z1, a2, b2, c2 and d2 each represents an integer of 0 to 3; y1 represents an integer 3 to 8, with the proviso that when a to z and a1 to y1 is/are a plural number, the plurality of the groups in the parenthesis may be the same or different, that at least one of z1, a2, c2 and d2 is an integer of 1 or more and that these suffixes satisfy the following relationships:

(a+b), (e+f+g), (k+l+m), (q+r+s), (w+x+y), (c1+d1), (g1+h1+i1+j1), (o1+p1) and (s1+t1) ≧2;

(j1+j1)≦3;

(r+u), (w+z), (x+a1), (y+b1), (c1+e1), (d1+f1), (p1+r1), (t1+v1) and (x1+w1)≦4 (with the further proviso that (w+z) and (x+a1) ≦5 in the case of formula (V)); and (a+c), (b+d), (e+h), (f+i), (g+j), (k+n), (l+o), (m+p), (q+t), (s+v), (g1+k1), (h1+l1), (i1+m1), (o1+q1) and (s1+u1) 5.

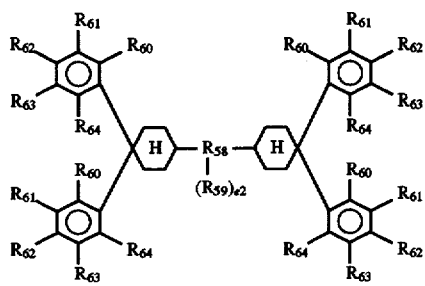

(XIII)

wherein:

$R_{58}$ represents an organic group, single bond, —S—,

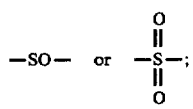

—SO— or —S—;

$R_{59}$ represents hydrogen atom, a monovalent organic group or a group:

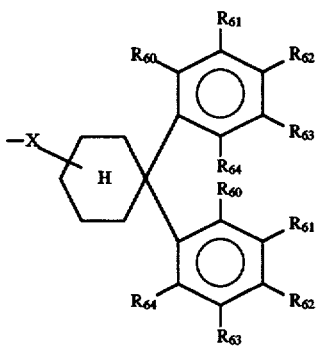

$R_{60}$ to $R_{64}$ may be the same or different and each represents hydrogen atom, hydroxyl group, a halogen atom, an alkyl group, an alkoxy group, an alkenyl group, —O—$R^0$—COO—$A^0$ group or —O—$B^0$group, with the proviso that at least two of $R_{60}$ to $R_{64}$ are —O—$R^0$—COO—$A^0$ group or —O—$B^0$ group and that the four or six substituents represented by the same symbol may not be the same group;

X represents a divalent organic group; and e2 represents 0 or 1

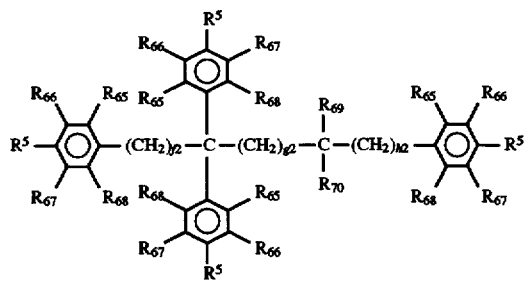

(XIV)

in which:

$R_{65}$ to $R_{68}$ may be the same or different and each represents hydrogen atom, hydroxyl group, a halogen atom, an alkyl group, an alkoxy group or an alkenyl group, with the proviso that the four, five or six substituents represented by the same symbol may not be the same group;

$R_{69}$ and $R_{70}$ each represents a hydrogen atom, an alkyl group or

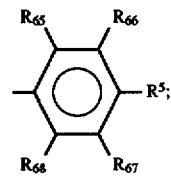

at least two of $R^5$'s are —O—$R^0$—COO—$A^0$ group or —O—$B^0$ group and the others are hydroxyl groups; and f2, h2 and g2 each represents an integer of 0 to 5.

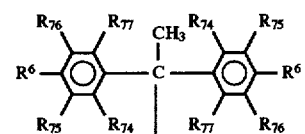

(XV)

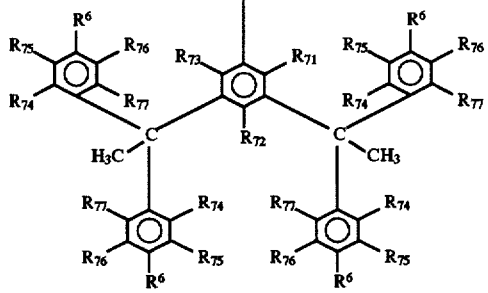

in which $R_{71}$ to $R_{77}$ may be the same or different and each represents hydrogen atom, hydroxyl group, a halogen atom, an alkyl group, an alkoxy group, nitro group, an alkenyl group, an aryl group, an aralkyl group, an alkoxycarbonyl group, an arylcarbonyl group, an acyloxy group, an acyl group, an aralkyloxy group or an aryloxy group, with the proviso that the four substituents represented by the same symbol may not be the same group; and at least two of $R^6$'s are —O—$R^0$—COO—$A^0$ group or —O—$B^0$ group and the others are hydroxyl groups.

(XVI)

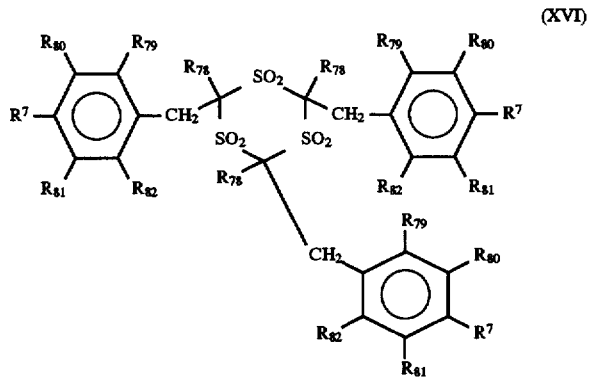

in which:

$R_{78}$ represents hydrogen atom or an alkyl group, with the proviso that the plurality of $R_{78}$'s may not be the same group;

$R_{79}$ to $R_{82}$ each represents hydroxyl group, hydrogen atom, a halogen atom, an alkyl group or an alkoxy group, with the proviso that the three substituents represented by the same symbol may not be the same group; and at least two of $R^7$ are —O—$R^o$—COO—$A^o$ group or —O—$B^o$ group and the others are hydroxyl groups.
Specific examples of preferred compound skeletons will be given below:
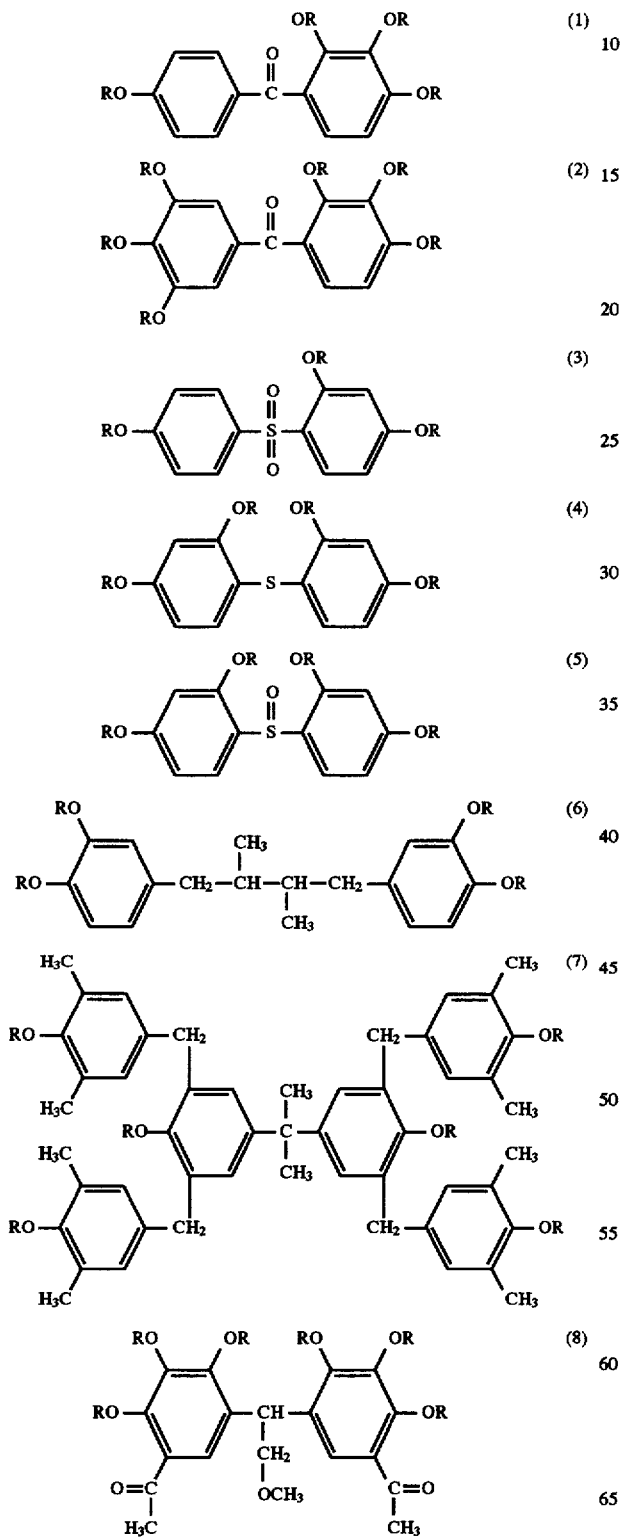
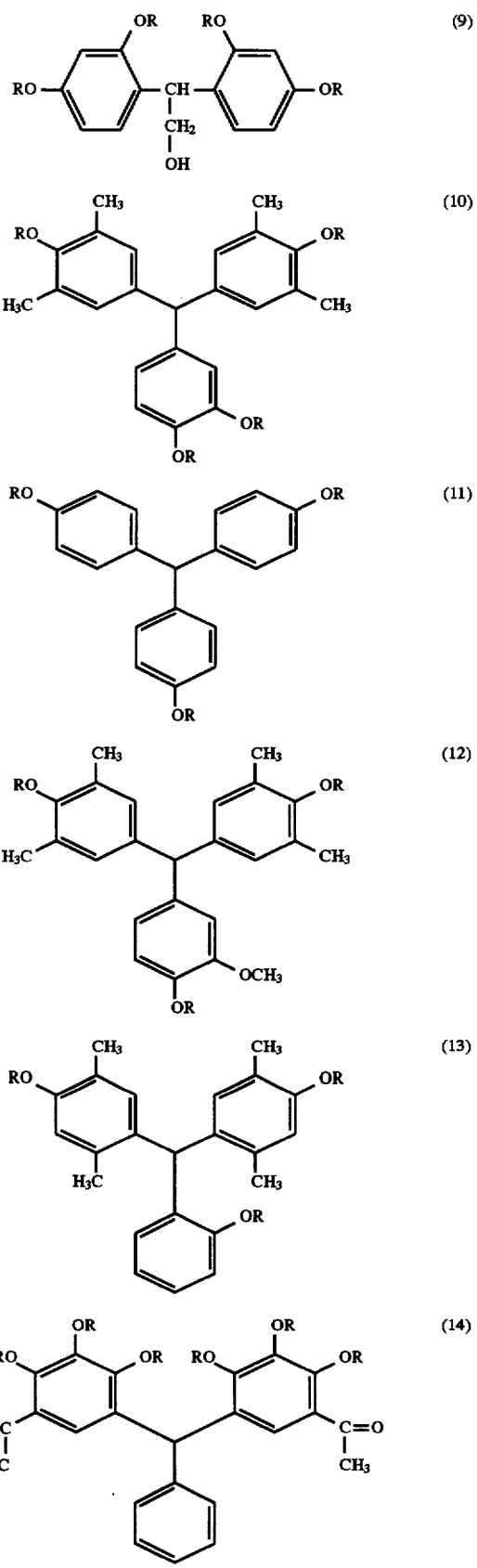

-continued
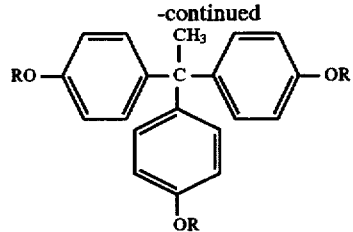 (15)
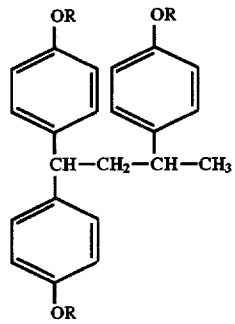 (16)
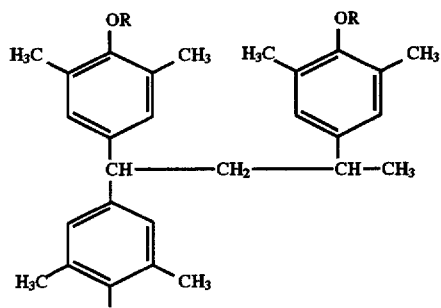 (17)
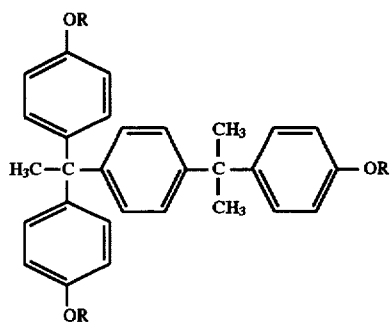 (18)
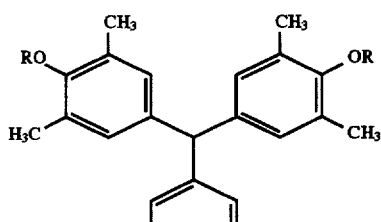 (19)
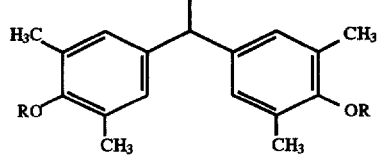
-continued
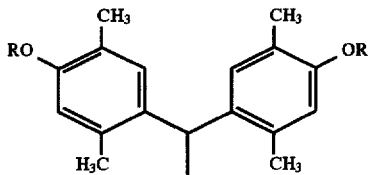 (20)
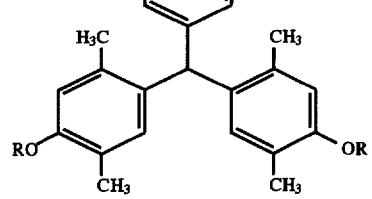 (21)
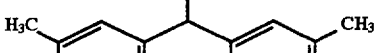 (22)
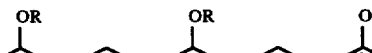 (23)
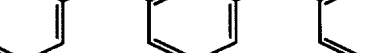 (24)
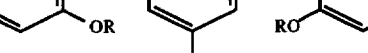 (25)
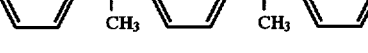 (26)

-continued
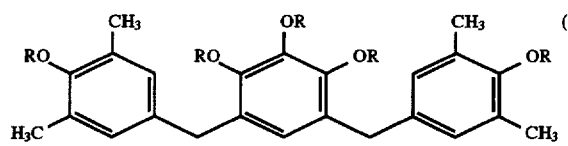 (27)
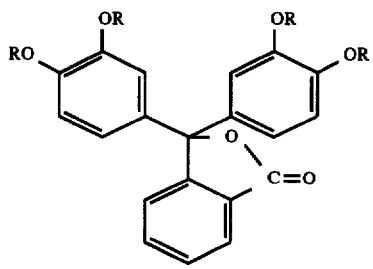 (28)
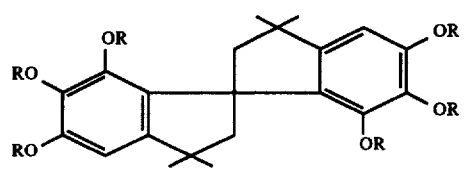 (29)
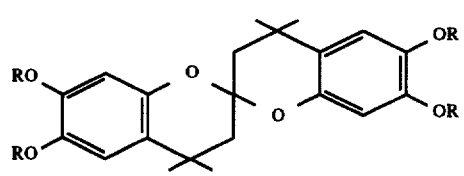 (30)
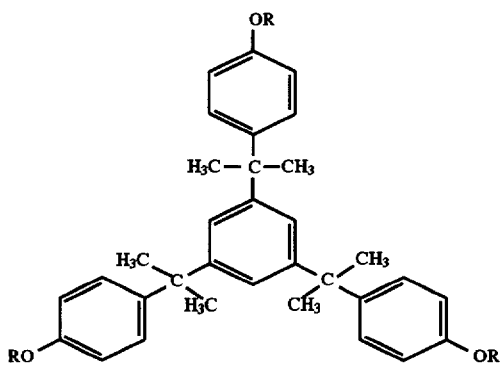 (31)
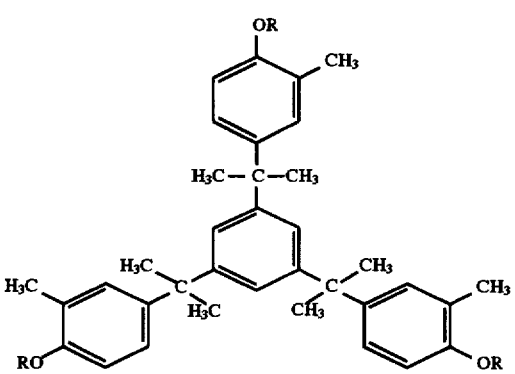 (32)
-continued
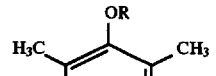 (33)
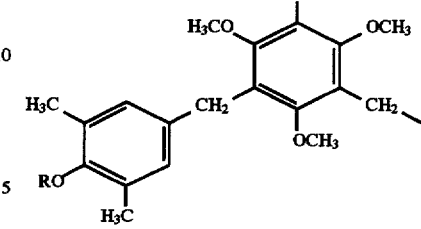
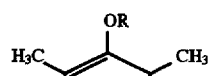 (34)
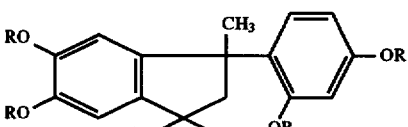 (35)
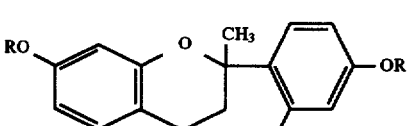 (36)
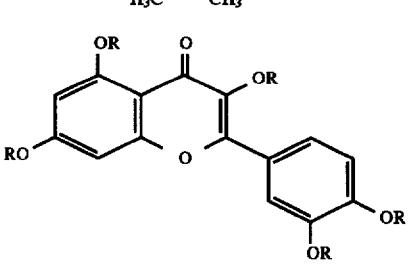 (37)
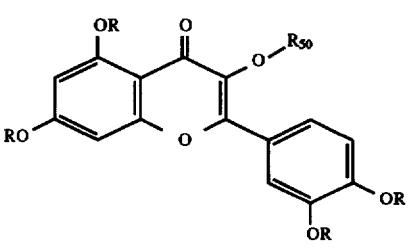 (38)

wherein R_{50} is
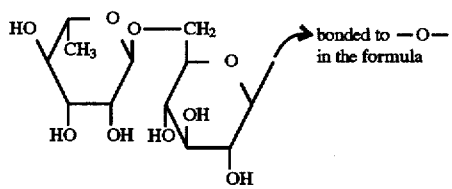
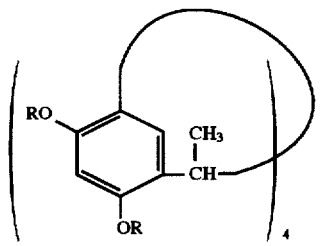
(39)
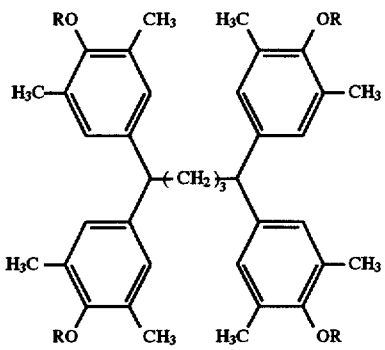
(40)
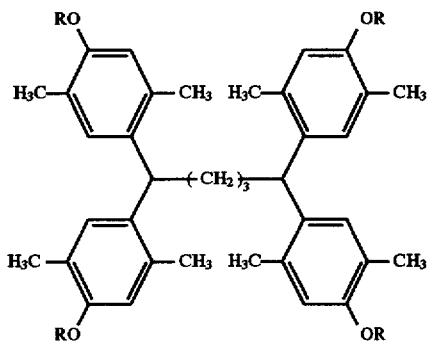
(41)
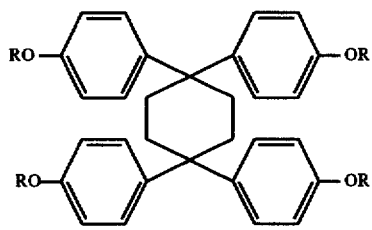
(42)
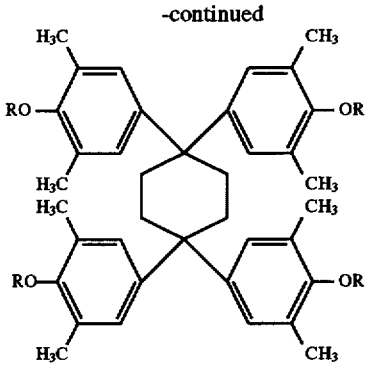
(43)
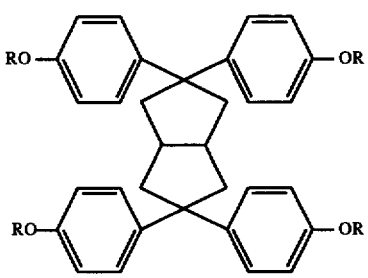
(44)
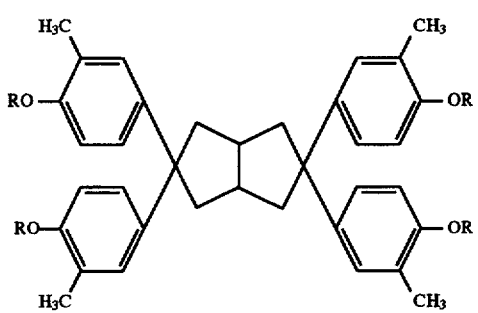
(45)
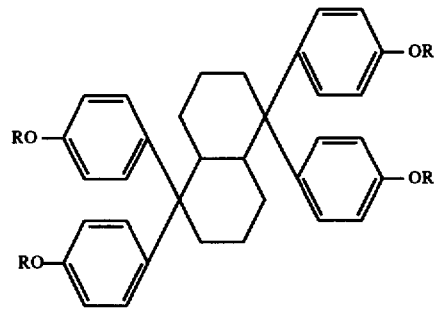
(46)
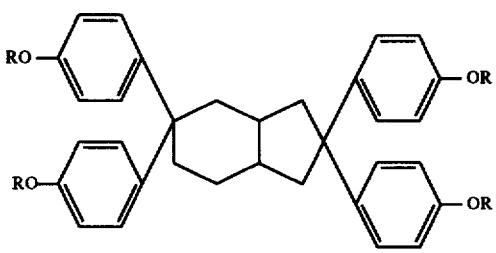
(47)

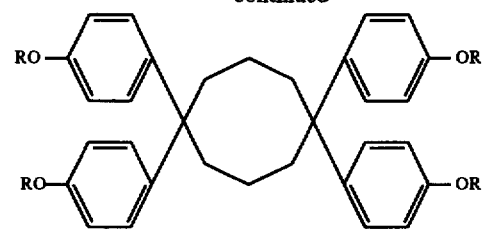
(48)
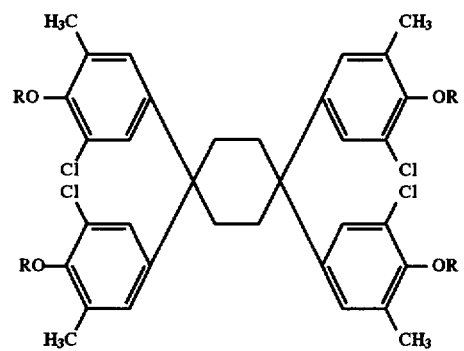
(49)
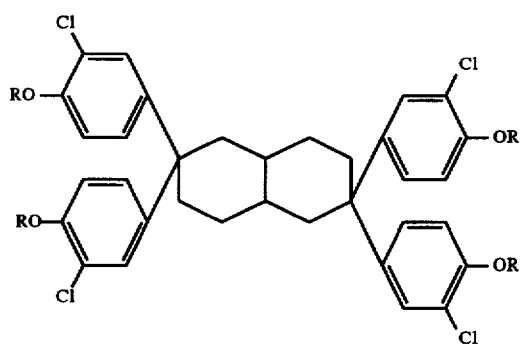
(50)
(51)
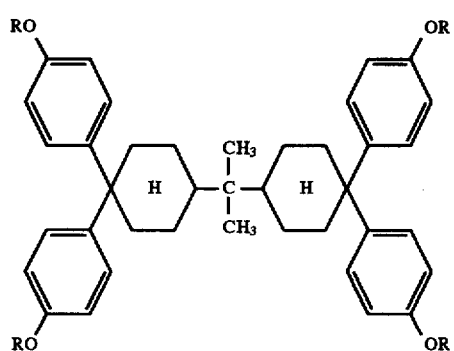
(52)
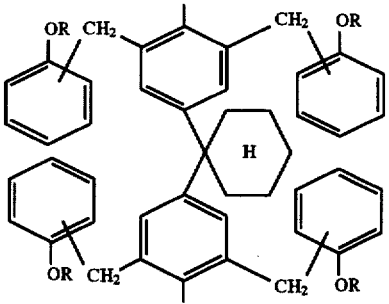
(53)
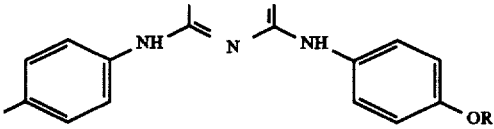
(54)
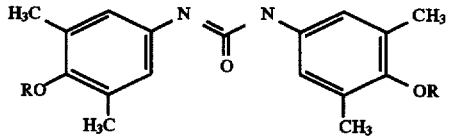
(55)
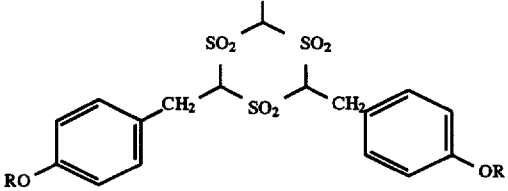
(56)

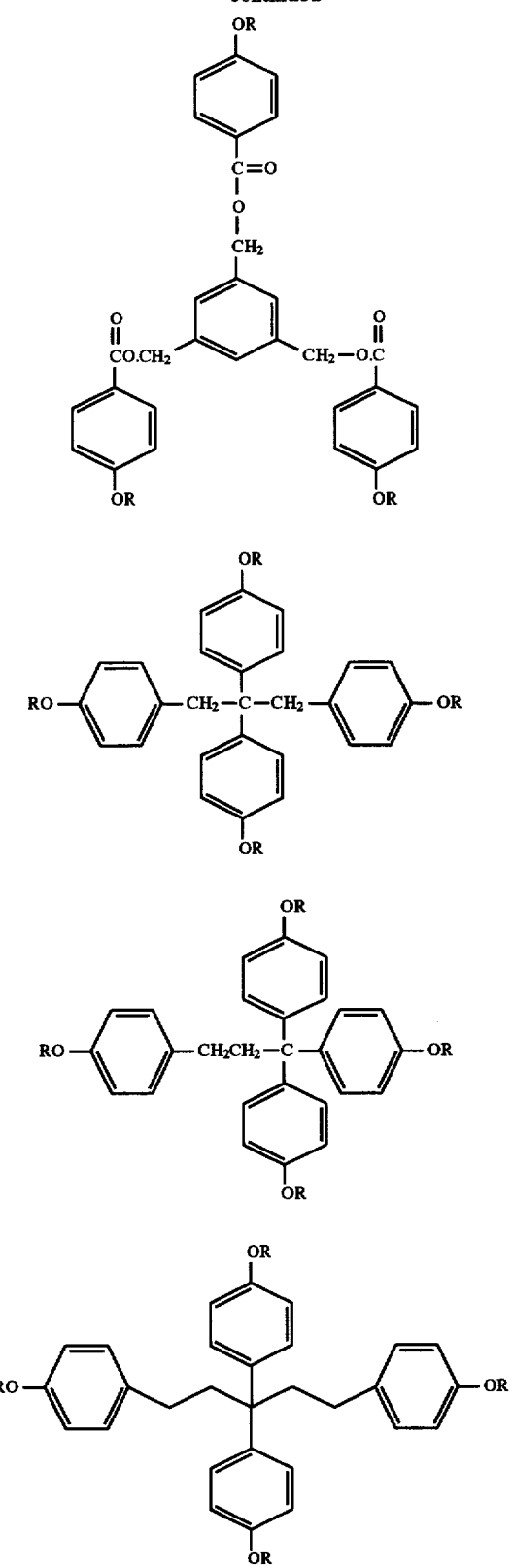

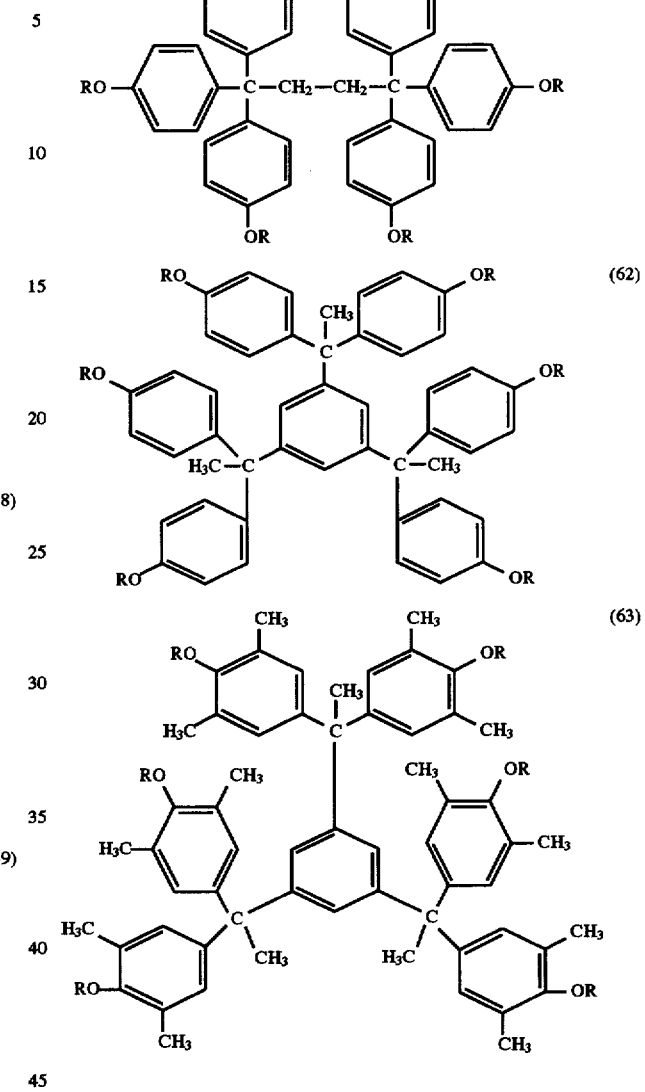

In the compounds (1) to (63), R represents hydrogen atom, —CH$_2$—COO—C(CH$_3$)$_2$C$_6$H$_5$, —CH$_2$—COO—C$_4$H$_9^T$, —COO—C$_4$H$_9^Y$, —CH(CH$_3$)—O—C$_2$H$_5$, —CH(CH$_3$)—O—C$_4$H$_9^t$, —CH$_2$—OCH$_3$, —C$_4$H$^t$ or

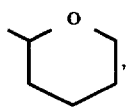

with the proviso that at least two, or three, depending on the structure, of R's are groups other than hydrogen atom and the plurality of R's may not be the same group.

The amount of the component (c) in the photosensitive composition of the present invention is 3 to 50% by weight, preferably 5 to 35% by weight, based on the total weight of the photosensitive composition (excluding the solvent).

The compound which generates an acid upon irradiation with active light or radiation to be used in the 2-component system chemically-sensitized resist of the present invention may be the same compound as mentioned above.

The resin containing a group which undergoes decomposition by an acid whereby increasing its solubility in an alkaline developer is a resin containing an acid-decomposable group in either or both of main chain and side chain, preferably in side chain.

The acid-decomposable group is preferably one containing —COOA° or —B° as mentioned above, more preferably one represented by —R°—COOA° or —Ar—O—B° as mentioned above.

In this instance, A° represents —C(R$^{01}$)(R$^{02}$)(R$^{03}$), —Si (R$^{01}$)(R$^{02}$)(R$^{03}$) or —C(R$^{04}$)(R$^{05}$)—O—R$^{06}$. B° represents A° or —CO—O—A° (in which R°, R$^{01}$ to R$^{06}$, and Ar are as defined above).

Preferred examples of the acid-decomposable group include silyl ether group, cumyl ester group, acetal group, tetrahydropyranyl ether group, enol ether group, enol ester group, tertiary alkyl ether group, tertiary alkyl ester group, and tertiary alkyl carbonate group. Among these compounds, tertiary alkyl ester group, tertiary alkyl carbonate group, cumyl ester group, and tetrahydropyranyl ether group are preferred.

The mother resin to which the acid-decomposable group is connected as a side chain is an alkali-soluble resin having in its side chain a group containing —OH or —COOH, preferably —R°—COOH or —Ar—OH group. Examples of the alkali-soluble resin include the foregoing alkali-soluble resin (a) according to the present invention.

The dissolution rate of the alkali-soluble resin in an alkali is preferably 170 Å/sec. or more, particularly 330 Å/sec. or more as determined in 0.261N tetramethylammonium hydroxide (TMAH) at 23° C.

In order to attain the rectangular profile, an alkali-soluble resin which exhibits a high transmission to far ultraviolet rays or excimer laser beam is preferred. In particular, an alkali-soluble resin exhibiting a transmittance at a thickness of 1 μm of from 20 to 80% at 248 nm is preferred.

In this respect, particularly preferred examples of such an alkali-soluble resin include o-, m-, or p-polyhydroxystyrene, copolymers thereof, hydrogenated polyhydroxystyrene, halogen- or alkyl-substituted polyhydroxystyrene, partial o-alkylation or o-acylation product of polyhydroxystyrene, styrene-hydroxystyrene copolymer, α-methylstyrene-hydroxystyrene copolymer, and hydrogenated novolak resin.

The acid-decomposable group-containing resin to be used in the present invention can be obtained by the reaction of an alkali-soluble resin with a precursor of an acid-decomposable group or the copolymerization of an alkali-soluble resin monomer having an acid-decomposable group with various another monomers as disclosed in European Patent 254853, JP-A-2-25850, JP-A-3-223860, and JP-A-4-251259

Specific examples of the acid-decomposable group-containing resin to be used in the present invention will be listed below, but the present invention should not be construed as being limited thereto.

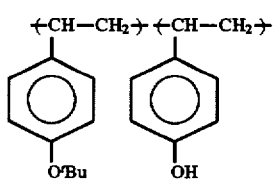
(i)

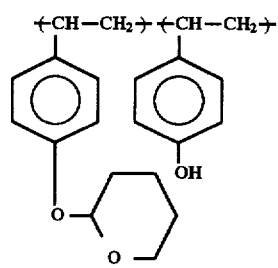
(ii)

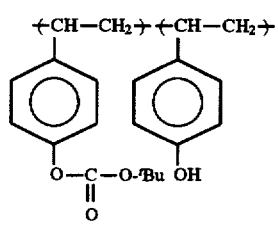
(iii)

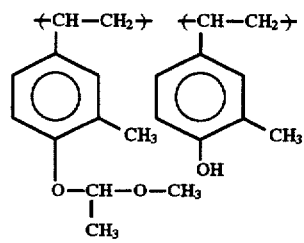
(iv)

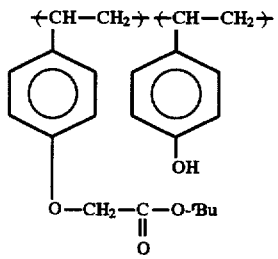
(v)

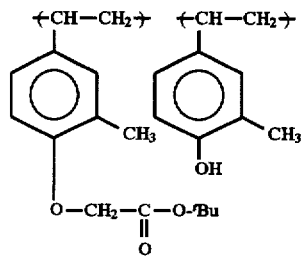
(vi)

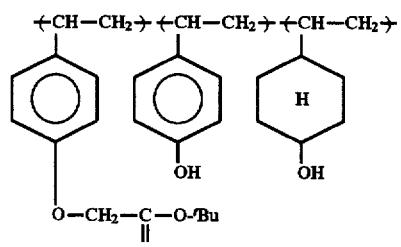
(vii)

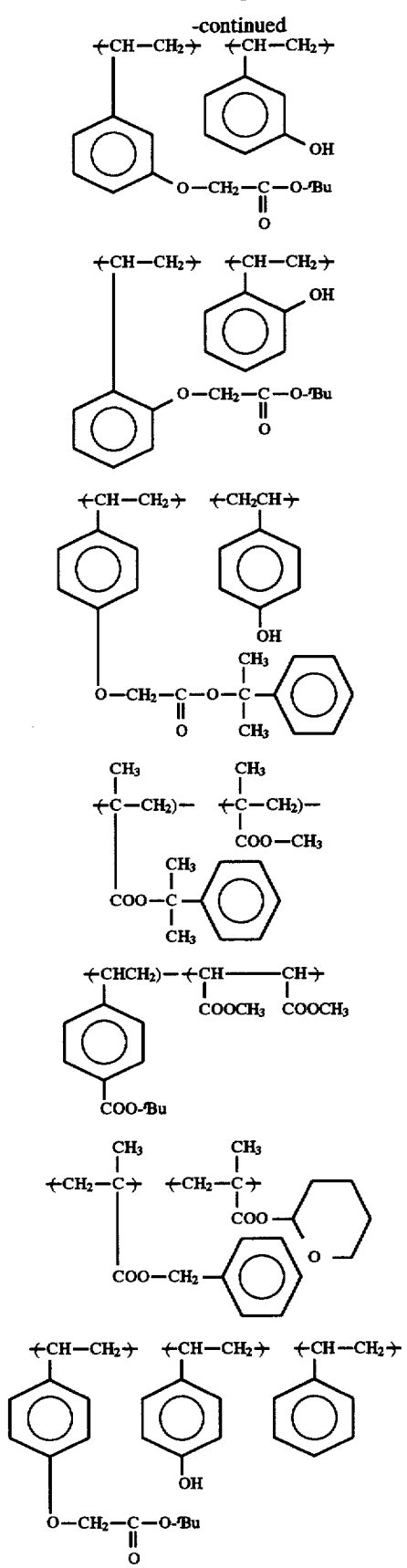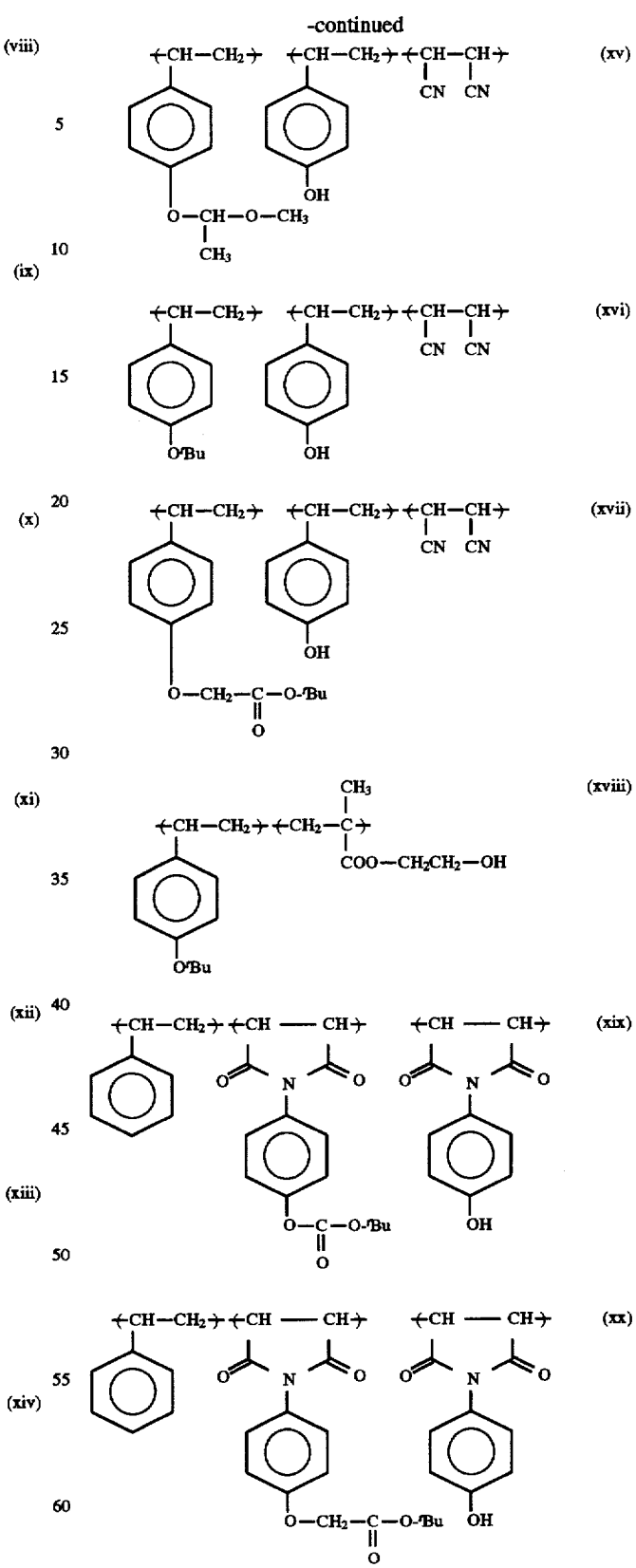

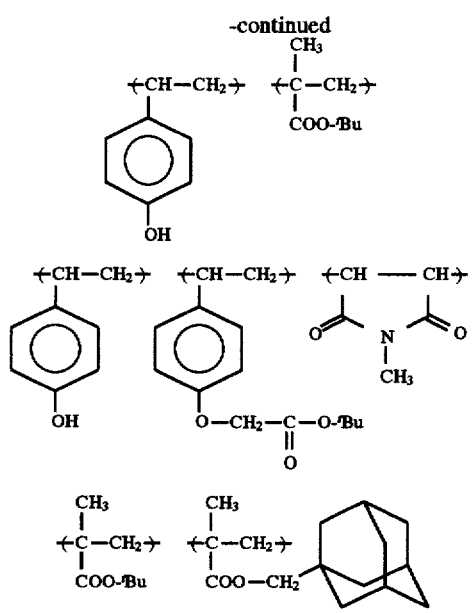

The content of the acid-decomposable group is represented by the equation B/(B+S) wherein B represents the number of acid-decomposable groups in the resin and S represents the number of alkali-soluble groups which are not protected by the acid-decomposable group. The content of the acid-decomposable group is preferably from 0.01 to 0.5, more preferably from 0.05 to 0.40, furthermore preferably from 0.05 to 0.30. If the content of the acid-decomposable group exceeds 0.5, it causes film shrinkage after PEB treatment, poor contact to substrate, and scumming. On the contrary, if the content of the acid-decomposable group falls below 0.01, a remarkable standing wave may remain on the side wall of a pattern.

The weight-average molecular weight (Mw) of the acid-decomposable group is preferably from 2,000 to 200,000. If the Mw of the acid-decomposable group falls below 2,000, the unexposed area causes a great decrease in the film thickness upon development. On the contrary, if the Mw of the acid-decomposable group exceeds 200,000, the dissolution rate of the alkali-soluble resin in an alkali reduces, whereby causing a decrease in the sensitivity. The Mw of the acid-decomposable group is preferably from 5,000 to 100,000, more preferably from 8,000 to 50,000.

The weight-average molecular weight of the acid-decomposable group is determined by gel permeation chromatography as calculated in terms of polystyrene.

Two or more acid-decomposable group-containing resins according to the present invention may be used in admixture. The amount of the resin to be used in the present invention is from 40 to 99% by weight, preferably from 60 to 95% by weight, based on the total weight of the photosensitive composition. In order to adjust the alkali solubility of the resin, the resin may be used in admixture with an alkali-soluble resin free of acid-decomposable group.

Similarly, the acid-decomposable group-containing resin may be used in admixture with the foregoing acid-decomposable low molecular dissolution-inhibitive compound. The content of the dissolution-inhibitive compound, if any, is from 1 to 45% by weight, preferably from 3 to 30% by weight, more preferably from 5 to 25% by weight, based on the total weight of the photosensitive composition (excluding the solvent).

If necessary, the photosensitive composition of the present invention may further comprise a dye, a pigment, a plasticizer, a surfactant, a photosensitizer, a compound containing two or more phenolic hydroxyl groups which accelerate the dissolution in the developer, and the like.

Preferred examples of the dye include oil-soluble dyes and basic dyes. Specific examples of such dyes include Oil Yellow #101, Oil Yellow #103, Oil Pink #312, Oil Green BG, Oil Blue BOS, Oil Blue #603, Oil Black BY, Oil Black BS, Oil Black T-505 (these dyes are available from Orient Chemical Industry), Crystal Violet (CI42555), Methyl Violet (CI42535), Rhodamine B (CI45170B), Malachite Green (CI42000), and Methylene Blue (CI52015).

It is possible to make the photosensitive composition according to the present invention be sensitive to i ray (365 nm) or g ray (436 nm) by adding thereto a spectral sensitizer to sensitize it to a wavelength range longer than the far ultraviolet range where the photo acid generator has no absorption. Specific and preferred examples of the spectral sensitizer include benzophenone, p,p'-tetramethyldiaminobenzophenone, p,p'-tetraethylethylaminobenzophenone, 2-chlorothioxanthone, anthrone, 9-ethoxyanthracene, pyrene, perylene, phenothiazine, benzyl, acridine orange, benzoflavine, cetoflavine-T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethyl-anthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonyl-bis(5,7-dimethoxycarbonylcoumarine), and coronene. However, the present invention should not be construed as being limited thereto.

The photosensitive composition according to the present invention is prepared by dissolving the foregoing components in a solvent capable of dissolving them and then applied to a support. Preferred examples of the solvent include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone, and tetrahydrofurane. These solvents may be used singly or in admixture.

A surfactant may be added to the solvent. Specific examples of the surfactant include nonionic surfactants such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkyl allyl ethers (e.g., polyoxyethylene octyl phenol ether, polyoxyethylene nonyl phenol ether), polyoxyethylene-polyoxypropylene block copolymers, sorbitan fatty acid esters (e.g., sorbitan monolaurate, sorbitan monopalmitate, sorbitan monostearate, sorbitan monooleate, sorbitan trioleate and sorbitan tristearate), polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate); fluorine surfactants such as F Top EF301, EF303, EF352 (available from Shinakita Kasei K.K.), Megafac F171, F173 (available from Dainippon Ink & Chemicals, Inc.), Florad FC430, FC431 (available from Sumitomo 3M), and Asahi Guard AG710, Surflon S-382, SC101, SC102, SC103, SC104, SC105, SC106 (available from Asahi Glass Company, Limited); Organosiloxane Polymer KP341 (available from The Shin-Etsu Chemical Industry Co., Ltd.); and acrylic or methacrylic (co)polymer Polyflow No. 75, No. 95 (available from Kyoeisha Yushi Kagaku Kogyo K.K.). The amount of the surfactant to be incorporated is normally in the range of 2 parts by weight or less, preferably 1 part by weight or less, based on 100 parts by weight of solid content of the composition according to the present invention.

These surfactants may be used singly or in combination of two or more of them.

The photosensitive composition thus prepared is applied to a substrate for use in the production of precision integrated circuit elements (e.g., silicon/silicon dioxide-coated substrate) by an appropriate coating means such as spinner and coater, exposed to light through a mask, and then baked for development to obtain an excellent resist pattern.

Examples of the developer used for the photosensitive composition according to the present invention include an alkaline aqueous solution of an inorganic alkali such as sodium hydroxide, potassium hydroxide, sodium carbonate, sodium silicate, sodium metasilicate and aqueous ammonia, a primary amine such as ethylamine and n-propylamine, a secondary amine such as diethylamine and di-n-butylamine, a tertiary amine such as triethylamine and methyldiethylamine, an alcoholamine such as dimethylethanolamine and triethanolamine, a quaternary ammonium salt such as tetramethylammonium hydroxide and tetraethylammonium hydroxide or a cyclic amine such as pyrrole and piperidine.

Further, the alkaline aqueous solution may be used in admixture with a proper amount of an alcohol, surfactant or the like.

The present invention will be further described in the following examples, but the present invention should not be construed as being limited thereto.

SYNTHESIS EXAMPLE 1

(Synthesis of Basic Group-Containing Resin 1)

11.4 g (0.070 mol) of 4-acetoxystyrene and 4.8 g (0.030 mol) of dimethylaminomethylstyrene were dissolved in 60 ml of 1-methoxy-2-propanol. The solution thus obtained was then heated to a temperature of 65° C. To the solution was then added 25 mg of V-65 (available from Wako Pure Chenicals Co., Ltd.) as a polymerization initiator in a stream of nitrogen while stirring. 25 mg of V-65 was then added to the solution every two hours for three times in total. The solution was then stirred at a temperature of 65° C. for 2 hours, and further at a temperature of 90° C. for 1 hour. The reaction mixture was then poured into 600 ml of methanol to obtain 14.1 g of a white resin.

To the resin were then added 100 ml of methanol, 20 ml of water, and 25.5 g of a 25% aqueous solution of tetramethylammonium hydroxide. The reaction mixture was then heated under reflux for 5 hours. The reaction mixture was then neutralized with acetic acid. The reaction mixture thus neutralized was then poured into 800 ml of ion-exchanged water to obtain 10.5 g of a white resin. The resin thus obtained was then identified by NMR as the compound exemplified by formula (d-2). The weight-average molecular weight of the resin was 16,000 as determined by GPC.

SYNTHESIS EXAMPLE 2

(Synthesis of Basic Group-Containing Resin 2)

12.2 g of a poly(p-hydroxystyrene) (available from Maruzen Petrochemical Co., Ltd.; weight-average molecular weight: 11,000) and 3.9 g (0.030 mol) of 4-chloromethylpyridine were dissolved in 100 ml of N,N-dimethylacetamide. To the solution thus obtained was then added 4.2 g (0.030 mol) of potassium carbonate. The mixture was then stirred at a temperature of 120° C. for 5 hours. To the mixture was then added 1.2 g of acetic acid. The resulting mixture was then poured into 1 l of ion-exchanged water.

As a result, 13.5 g of a light-brown resin was obtained. The resin thus obtained was then identified as the compound exemplified by formula (d-3) by NMR. The weight-average molecular weight of the resin was 12,000 as determined by GPC.

SYNTHESIS EXAMPLE 3

(Synthesis of Dissolution-Inhibitive Compound 1)

20 g of α, α', α"-tris(4-hydroxyphenyl)-1,3,5-triisopropylbenzene was dissolved in 400 ml of tetrahydrofuran. To the solution thus obtained was then added 14 g of tert-butoxypotassium in an atmosphere of nitrogen. The mixture was then stirred at room temperature for 10 minutes. To the mixture was then added 29.2 g of di-tert-butyl dicarbonate. The reaction mixture was then allowed to react at room temperature for 3 hours. The reaction solution was then poured into ice water. The reaction product was then extracted with ethyl acetate. The resulting ethyl acetate phase was washed with water, and then dried. The solvent was then distilled off. The resulting crystalline solid was recrystallized from diethyl ether, and then dried to obtain 25.6 g of the compound exemplified by formula (31) (in which R's are all t-BOC groups).

SYNTHESIS EXAMPLE 4

(Synthesis of Dissolution-Inhibitive Compound 2)

20 g of a, a', a"-tris(4-hydroxyphenyl)-1,3,5-triisopropylbenzene was dissolved in 400 ml of diethyl ether. To the solution thus obtained was then added 31.6 g of 3,4-dihydro-2H-pyran and the catalytic amount of hydrochloric acid. The reaction mixture was then allowed to react under reflux for 24 hours. After the completion of the reaction, a small amount of sodium hydroxide was added to the reaction solution. The reaction solution was then filtered. The solvent in the filtrate was then distilled off. The resulting reaction product was purified by column chromatography, and then dried to obtain the compound exemplified by formula (31) (in which R's are all THP groups).

SYNTHESIS EXAMPLE 5

(Synthesis of Dissolution-Inhibitive Compound 3)

To a solution of 19.2 g (0.040 mol) of α, α', α"-tris(4-hydroxyphenyl)-1,3,5-triisopropylbenzene in 120 ml of N,N-dimethylacetamide were added 21.2 g (0.15 mol) of potassium carbonate and 27.1 g (0.14 mol) of t-butyl bromoacetate. The reaction mixture was then stirred at a temperature of 120° C. for 7 hours. Thereafter, the reaction mixture was poured into 1.5 l of water. The reaction mixture was then extracted with ethyl acetate. The solution thus extracted was then dried over magnesium sulfate. The extract was then concentrated, and then purified by column chromatography (carrier: silica gel; developing solvent: 3/7 (volume) mixture of ethyl acetate and n-hexane) to obtain 30 g of a light-yellow viscous solid. The solid was then identified as the compound exemplified by formula (31) (in which R's are all —$CH_2COOC_4H_9^T$ groups) by NMR.

SYNTHESIS EXAMPLE 6

(Synthesis of Dissolution-Inhibitive Compound 4)

42.4 g (0.10 mol) of 1[α-methyl-α-(4'-hydroxy-phenyl)ethyl]-4-[α',α'-bis(4"-hydroxyphenyl)ethyl]benzene was dissolved in 300 ml of N,N-dimethylacetamide. To the solution thus obtained were then added 49.5 g (0.35 mol) of potassium carbonate and 84.8 g (0.33 mol) of cumyl bromoacetate. Thereafter, the reaction mixture was stirred at a temperature of 120° C. for 7 hours. The reaction mixture was then poured into 2 l of ion-exchanged water, neutralized with acetic acid, and then extracted with ethyl acetate. The extract was concentrated, and then purified in the same manner as in Synthesis Example 5 to obtain 70 g of the compound exemplified by formula (18) (in which R's are all —$CH_2COOC(CH_3)_2C_6H_5$ groups).

SYNTHESIS EXAMPLE 7

(Synthesis of Dissolution-Inhibitive Compound 5)

To a solution of 14.3 g (0.020 mol) of $\alpha,\alpha,\alpha',\alpha',\alpha'',\alpha''$-hexakis(4-hydroxyphenyl)-1,3,5-triethylbenzene in 120 ml of N,N-dimethylacetamide were added 21.2 g (0.15 mol) of potassium carbonate and 27.1 g (0.14 mol) of t-butyl bromoacetate. The reaction mixture was then stirred at a temperature of 120° C. for 7 hours. Thereafter, the reaction mixture was poured into 1.5 l of water. The reaction mixture was then extracted with ethyl acetate. The solution thus extracted was then dried over magnesium sulfate. The extract was then concentrated, and then purified by column chromatography (carrier: silica gel; developing solvent: 2/8 (volume) mixture of ethyl acetate and n-hexane) to obtain 24 g of a light-yellow powder. The powder was identified as the compound exemplified by formula (62) (in which R's are all —$CH_2$—$COO$—$C_4H_9{}'$groups) by NMR.

SYNTHESIS EXAMPLE 8

(Synthesis of Dissolution-Inhibitive compound 6)

20 g (0.042 mol) of $\alpha,\alpha',\alpha''$-tris(4-hydroxyphenyl)-1,3,5-triisopropylbenzene was dissolved in 400 ml of tetrahydrofuran (THF). To the solution thus obtained was then added 9.3 g (0.083 mol) of t-butoxypotassium in an atmosphere of nitrogen. The reaction mixture was then stirred at room temperature for 10 minutes. To the reaction mixture was then added 19.5 g (0.087 mol) of di-t-butyldicarbonate. The reaction mixture was then allowed to react at room temperature for 3 hours. The reaction solution was then poured into ice water. The resulting product was extracted with ethyl acetate.

The ethyl acetate extract was concentrated, and then subjected to fractional purification by column chromatography (carrier: silica gel; developing solvent: 1/5 (volume) mixture of ethyl acetate and n-hexane). As a result, 7 g of the compound exemplified by formula (31) (in which two R's represent t-BOC group, and one R represents hydrogen atom) was obtained.

SYNTHESIS EXAMPLE 9

(Synthesis of Dissolution-Inhibitive Compound 7)

48.1 g (0.10 mol) of $\alpha,\alpha',\alpha''$-tris(4-hydroxyphenyl)-1,3,5-triisopropylbenzene was dissolved in 300 ml of dimethylacetamide. To the solution were then added 22.1 g (0.16 mol) of potassium carbonate and 42.9 g (0.22 mol) of t-butyl bromoacetate. Thereafter, the reaction mixture was stirred at a temperature of 120° C. for 5 hours. The reaction mixture was then poured into 2 l of ion-exchanged water. The reaction mixture was neutralized with acetic acid, and then extracted with ethyl acetate.

The ethyl acetate extract was concentrated, and then subjected to fractional purification by column chromatography (carrier: silica gel; developing solvent: 1/5 (volume) mixture of ethyl acetate and n-hexane). As a result, 10 g of the compound exemplified by formula (31) (in which two R's represent —$CH_2$—$COO$—$C_4H_9{}'$ group, and one R represents hydrogen atom) was obtained.

SYNTHESIS EXAMPLE 10

(Synthesis of Novolak Resin)

40 g of m-cresol, 60 g of p-cresol, 49 g of a 37% aqueous solution of formaldehyde, and 0.13 g of oxalic acid were charged into a three-necked flask. The reaction mixture was heated with stirring to a temperature of 100° C. where it was then allowed to react for 15 hours.

The reaction solution was heated to a temperature of 200° C. while the pressure of the system was then gradually reduced to 5 mmHg to remove water, unreacted monomers, formaldehyde, oxalic acid, etc. therefrom. The molten alkali-soluble novolak resin (NOV.3) was cooled to room temperature, and then recovered. The novolak resin (NOV.3) thus obtained had a weight-average molecular weight of 7,100 (in terms of polystyrene).

Similarly, the following novolak resins were synthesized using the monomer compositions shown below.

NOV.1: m-cresol/p-cresol=60/40; Mw=12,000

NOV.2: m-cresol/p-cresol=50/50; Mw=8,700

NOV.4: m-cresol/p-cresol/3,5-xylenol=25/50/28; Mw=5,200

NOV.5: m-cresol/2,3,5-trimethylphenol=55/57; Mw=5,800

20 g of the novolak resin (NOV.3) thus obtained was dissolved in 60 g of methanol completely. To the solution thus obtained was then gradually added 30 g of water to cause the resinous content to be precipitated.

The uppermost phase was then removed by decantation so that the resinous content thus precipitated was recovered. The resinous content thus recovered was heated to a temperature of 40° C. where it was then dried under reduced pressure for 24 hours to obtain an alkali-soluble novolak resin (NOV. 6). The weight-average molecular weight of the alkali-soluble novolak resin thus obtained was 8,000 (in terms of polystyrene).

85 g of m-cresol, 15 g of p-cresol, and 53 g of a 37% aqueous solution of formaldehyde were charged into a three-necked flask. The mixture was then thoroughly stirred while being heated over an oil bath at 110° C. To the mixture was then added 2.4 g of lead acetate dihydrate. The reaction mixture was then heated with stirring for 5 hours. 100 g of the same cresol mixture as used herein and 47 g of the same aqueous solution of formaldehyde were then charged into the same flask. The reaction mixture was stirred for additional 1 hour while heating. The reaction mixture was then cooled to a temperature of 80° C. 0.2 g of oxalic acid was then added to the reaction mixture. The reaction mixture was then allowed to react under reflux over the oil bath at a temperature of 110° C. for 15 hours. The content of the flask was then poured into water containing 1% of hydrochloric acid. The reaction product was then extracted with ethyl cellosolve acetate. The extract was moved to a vacuum distillation column where it was then heated to a temperature of 200° C. so that it was dehydrated. The reaction product was then distilled under a pressure of 2 to 3 mmHg for 2 hours to remove the residual monomers. The resulting molten polymer was recovered from the flask to obtain the desired novolak resin (NOV.7; Mw: 7,500).

EXAMPLES 1–22 AND COMPARATIVE EXAMPLES 1–4

The compounds according to the present invention prepared by the foregoing Synthesis Examples were used to prepare resists. The formulation of these resists are set forth in Table 1.

TABLE 1

(Formulation of photosensitive composition)

| Example No. | Alkali-soluble resin Kind | Amount (g) | Photo-acid generating agent Kind | Amount (g) | Dissolution-inhibitive compound Kind | Amount (g) | Acid-decomposable group | Basic group-containing resin Kind | Amount (g) |
|---|---|---|---|---|---|---|---|---|---|
| EXAMPLE 1 | NOV.2 | 1.5 | PAG4-5 | 0.05 | BTBPP | 0.50 | TBOC | d-3 | 0.01 |
| EXAMPLE 2 | NOV.3 | 1.5 | PAG4-5 | 0.05 | Compound(18) | 0.50 | TBOC | d-2 | 0.01 |
| EXAMPLE 3 | NOV.4 | 1.5 | PAG3-5 | 0.05 | Compound(16) | 0.50 | THP | d-33 | 0.01 |
| EXAMPLE 4 | PHS/St | 1.5 | PAG4-5 | 0.05 | Compound(60) | 0.50 | TBE | d-1 | 0.01 |
| EXAMPLE 5 | PHS/St | 1.5 | PAG4-8 | 0.05 | Compound(15) | 0.50 | CUE | d-2 | 0.01 |
| EXAMPLE 6 | PHS/AcSt | 1.5 | PAG4-28 | 0.05 | Compound(18) | 0.50 | TBE | d-3 | 0.01 |
| EXAMPLE 7 | PHS/OHS | 1.5 | PAG5-12 | 0.05 | Compound(20) | 0.50 | THP | d-4 | 0.01 |
| EXAMPLE 8 | NOV.1 | 1.5 | PAG5-11 | 0.05 | Compound(19) | 0.50 | TBOC | d-36 | 0.01 |
| EXAMPLE 9 | NOV.3 | 1.5 | PAG6-14 | 0.05 | Compound(36) | 0.50 | TBE | d-33 | 0.01 |
| EXAMPLE 10 | NOV.5 | 1.5 | PAG4-7 | 0.05 | Compound(18) | 0.50 | TBE | d-6 | 0.01 |
| EXAMPLE 11 | PHS/St | 1.5 | PAG4-5 | 0.05 | Compound(31) (Synthesis Example 8) | 0.50 | TBOC | d-3 | 0.01 |
| EXAMPLE 12 | PHS/OHS | 1.5 | PAG4-5 | 0.05 | Compound(31) (Synthesis Example 9) | 0.50 | TBE | d-2 | 0.01 |
| EXAMPLE 13 | PHS/AcSt | 1.5 | PAG4-9 | 0.05 | Compound(31) | 0.50 | CUE | d-10 | 0.01 |
| EXAMPLE 14 | PHS/St | 1.5 | PAG5-9 | 0.05 | Compound(40) | 0.50 | TBE | d-1 | 0.01 |
| EXAMPLE 15 | PHS/OHS | 1.5 | PAG4-5 | 0.05 | Compound(62) | 0.50 | TBE | d-23 | 0.01 |
| EXAMPLE 16 | NOV.7 | 1.5 | PAG6-15 | 0.05 | Compound(41) | 0.50 | THP | d-36 | 0.01 |
| EXAMPLE 17 | PHS/TBOMS | 1.5 | PAG4-5 | 0.05 | Compound(60) | 0.50 | TBOC | d-26 | 0.01 |
| EXAMPLE 18 | PHS/TBOMS | 1.5 | PAG4-8 | 0.05 | Compound(60) | 0.50 | TBE | d-6 | 0.01 |
| EXAMPLE 19 | PHS/TBOMS | 1.5 | PAG4-5 | 0.05 | Compound(31) (Synthesis Example 8) | 0.50 | TBOC | d-4 | 0.01 |
| EXAMPLE 20 | PHS/TBOCS | 1.5 | PAG4-5 | 0.05 | Compound(15) | 0.50 | TBE | d-6 | 0.01 |
| EXAMPLE 21 | PHS/TBOCS | 1.0 | PAG4-5 | 0.08 | — | — | — | d-2 | 0.01 |
| EXAMPLE 22 | PHS/TBOCS | 1.0 | PAG4-5 | 0.08 | — | — | — | d-3 | 0.01 |
| COMPARATIVE EXAMPLE 1 | PHS/St | 1.5 | PAG4-5 | 0.05 | Compound(60) | 0.50 | TBE | Im | 0.01 |
| COMPARATIVE EXAMPLE 2 | PHS/TBOMS | 1.5 | PAG4-5 | 0.05 | Compound(31) (Synthesis Example 8) | 0.50 | TBOC | ANA | 0.01 |
| COMPARATIVE EXAMPLE 3 | PHS/TBOMS | 1.0 | PAG4-5 | 0.08 | — | — | — | BAPM | 0.01 |
| COMPARATIVE EXAMPLE 4 | PHS/VP | 1.5 | PAG4-5 | 0.05 | Compound(15) | 0.50 | TBE | — | — |

Nitrogen-containing resin: d-4: m/n/l = 50/30/20; Others: m/n = 70/30

The abbreviations used in Table 1 stand for the following compounds:
Polymer (figures in parentheses indicate molar ratio):
NOV.1–7: Novolak resin
PHS/St: p-Hydroxystyrene/styrene copolymer (85/15) (weight-average molecular weight: 25,000)
PHS/TBOCS: p-Hydroxystyrene/t-butoxycarbonyloxystyrene copolymer (70/30) (weight-average molecular weight: 21,000)
PHS/TBOMS: P-Hydroxystyrene/t-butoxycarbonylmethyloxy styrene copolymer (80/20) (weight-average molecular weight: 35,000)
PHS/VP: P-Hydroxystyrene/4-vinylpyridine copolymer (97/3) (weight-average molecular weight: 18,000)
PHS/AcST: P-Hydroxystyrene/p-acetoxystyrene (80/20) (weight-average molecular weight: 12,000)
PHS/OHS: P-Hydroxystyrene/o-hydroxystyrene (80/20) (weight-average molecular weight: 32,000)
Dissolution-Inhibitive Compound:
BTBPP: 2,2-Bis(t-butoxycarbonyloxyphenyl)propane
Acid-decomposable group in the Dissolution-Inhibitive compound:
TBOC: —O—COO—$C_4H_9^t$
TBE: —O—CH$_2$—COO—$C_4H_9^t$
CUE: —O—CH$_2$—COO—C(CH$_3$)$_2$C$_6$H$_5$ THP: 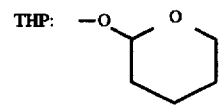

Lower molecular amine compound:
Im: Imidazole
ANA: Anthranilic acid
BAPM: Bis(4-aminophenylmethane)

PREPARATION AND EVALUATION OF PHOTOSENSITIVE COMPOSITION

The respective materials shown in Table 1 were dissolved in 9.5 g of propylene glycol monomethyl ether acetate. The solutions were then filtrated through a filter having a pore diameter of 0.2 μm to prepare resist solutions. These resist solutions were applied to a silicon wafer by means of a spin coater, and then dried over a vacuum adsorption type hot plate at 120° C. for 60 seconds to obtain a resist layer with a layer thickness of 1.0 m.

This resist layer was subjected to exposure with a 248 nm KrF excimer laser stepper (NA=0.45). Immediately after the exposure or 1 hour after the exposure, the resist layer was heated over the vacuum adsorption type hot plate at a temperature of 100° C. for 60 seconds, and then immediately dipped in a 2.38% aqueous solution of tetramethylammonium hydroxide (TMAH) for 60 seconds, followed by rinsing with water for 30 seconds and drying. The patterns thus obtained on the silicon wafer by conducing the heat treatment at immediately after the exposure and 1 hour after the exposure were evaluated for their profile, sensitivity and resolving power in the following manner. The results are set forth in Table 2.

Profile:

The patterns thus obtained on the silicon wafer were observed under a scanning electron microscope to evaluate a profile of the resist.

Sensitivity:

The sensitivity is defined as exposure amount at which a 0.50 μm mask pattern can be reproduced.

Resolving power:

The resolving power indicates the critical resolving power at the exposure at which a 0.50 m mask pattern can be reproduced.

On the other hand, it can be seen in Table 2 that the resists of Comparative Examples 1 to 4 show deterioration in resolving power and profile with time as compared with the present invention.

As mentioned above, the chemically-sensitized positive working photosensitive composition of the present invention easily and properly inhibits acid diffusion and acid deactivation at the surface of the resist during the time between the exposure and the heat treatment, keeps the dissolution-inhibiting effect exerted by the dissolution-inhibitive compound and exhibits a good profile, a high sensitivity and a high resolving power.

While the invention has been described in detail and with reference to specific embodiments thereof, it will be apparent to one skilled in the art that various changes and modifications can be made therein without departing from the spirit and scope thereof.

What is claimed is:

1. A positive working photosensitive composition which comprises:

(a) a resin which is insoluble in water but soluble in an alkaline aqueous solution;

TABLE 2

(Results of evaluation)

| | Heated immediately after exposure | | | Heated 1 hour after exposure | | |
|---|---|---|---|---|---|---|
| | Sensitivity (mJ/cm²) | Resolving power (μm) | Profile of resist pattern | Sensitivity (mJ/cm²) | Resolving power (μm) | Profile of resist pattern |
| EXAMPLE 1 | 20 | 0.32 | Good | 22 | 0.33 | Good |
| EXAMPLE 2 | 24 | 0.28 | Good | 24 | 0.28 | Good |
| EXAMPLE 3 | 30 | 0.28 | Good | 30 | 0.28 | Good |
| EXAMPLE 4 | 26 | 0.26 | Very Good | 28 | 0.26 | Very Good |
| EXAMPLE 5 | 28 | 0.28 | Good | 30 | 0.30 | Good |
| EXAMPLE 6 | 24 | 0.28 | Very Good | 24 | 0.28 | Good |
| EXAMPLE 7 | 32 | 0.30 | Good | 32 | 0.30 | Good |
| EXAMPLE 8 | 30 | 0.30 | Good | 30 | 0.30 | Good |
| EXAMPLE 9 | 32 | 0.30 | Good | 33 | 0.31 | Good |
| EXAMPLE 10 | 25 | 0.28 | Good | 26 | 0.28 | Good |
| EXAMPLE 11 | 18 | 0.25 | Very Good | 20 | 0.26 | Very Good |
| EXAMPLE 12 | 18 | 0.25 | Very Good | 18 | 0.25 | Very Good |
| EXAMPLE 13 | 28 | 0.26 | Good | 30 | 0.28 | Good |
| EXAMPLE 14 | 32 | 0.32 | Good | 32 | 0.32 | Good |
| EXAMPLE 15 | 26 | 0.28 | Very Good | 28 | 0.28 | Very Good |
| EXAMPLE 16 | 30 | 0.30 | Good | 33 | 0.32 | Good |
| EXAMPLE 17 | 24 | 0.26 | Very Good | 25 | 0.26 | Very Good |
| EXAMPLE 18 | 22 | 0.26 | Very Good | 23 | 0.26 | Very Good |
| EXAMPLE 19 | 18 | 0.25 | Very Good | 18 | 0.25 | Very Good |
| EXAMPLE 20 | 20 | 0.28 | Very Good | 21 | 0.28 | Very Good |
| EXAMPLE 21 | 32 | 0.32 | Good | 34 | 0.33 | Good |
| EXAMPLE 22 | 32 | 0.32 | Good | 34 | 0.33 | Good |
| Comparative Example 1 | 68 | 0.36 | Tapered | 94 | 0.48 | Tapered and T-top |
| Comparative Example 2 | 42 | 0.34 | Tapered | 65 | 0.40 | Tapered and T-top |
| Comparative Example 3 | 56 | 0.36 | Tapered | 82 | 0.45 | Tapered and T-top |
| Comparative Example 4 | 240 | 0.40 | Tapered and film thickness reduced | 265 | 0.42 | Tapered and film thickness reduced |

(Note) T-top: T-shaped resist surface

The results shown in Table 2 demonstrate that the resist of the present invention is a positive working photosensitive composition which is insusceptible to acid diffusion and deactivation of acid at the surface of the resist during the time between the exposure and the heat treatment, can keep the dissolution-inhibiting effect exerted by the dissolution-inhibitive compound and exhibits a good profile, a high sensitivity and a high resolving power.

(b) a compound which generates an acid upon irradiation with active light or radiation;

(c) a low molecular acid-decomposable dissolution-inhibitive compound having a molecular weight of 3,000 or less and containing a group decomposable with an acid, and which increases its solubility in an alkaline developer by the action of an acid; and (d) a resin containing a basic nitrogen atom and having a weight-average molecular weight of 2,000 or more;

wherein said resin containing a basic nitrogen atom and having a weight-average molecular weight of 2,000 or more is selected from the group consisting of:
  (i) a copolymer prepared from a monomer having a basic group and a monomer having an alkali-soluble group;
  (ii) a copolymer prepared by polycondensation of an aromatic compound containing a basic group with an aldehyde or a ketone group; and
  (iii) a copolymer prepared by polycondensation of a phenolic compound with an aldehyde containing a basic group.

2. The positive working photosensitive composition of claim 1, wherein said component (c) is at least one compound selected from the group consisting of:
  (i) a compound having at least two acid-decomposable groups, wherein the two acid-decomposable groups exist at a distance of at least 10 bonding atoms excluding the acid-decomposable groups themselves; and
  (ii) a compound having at least three acid-decomposable groups, wherein the farthest two acid-decomposable groups among the at three acid-decomposable groups exist at a distance of at least 9 bonding atoms excluding the acid-decomposable groups themselves.

3. The positive working photosensitive composition of claim 2, wherein the molar ratio of said component (b) to basic nitrogen atom in said component (d) is from 1/2 to 100/1.

4. The positive working photosensitive composition of claim 1, wherein the molar ratio of said component (b) to basic nitrogen atom in said component (d) is from 1/2 to 100/1.

5. A positive-working photosensitive composition, comprising:
  (1) a compound which generates an acid upon irradiation with active light or radiation;
  (2) a resin containing a group which undergoes decomposition by an acid whereby increasing its solubility in an alkaline developer; and
  (3) a resin containing a basic nitrogen atom and having a weight-average molecular weight of 2,000 or more;
  wherein said resin containing a basic nitrogen atom and having a weight-average molecular weight of 2,000 or more is selected from the group consisting of:
    (i) a copolymer prepared from a monomer having a basic group and a monomer having an alkali-soluble group;
    (ii) a copolymer prepared by polycondensation of an aromatic compound containing a basic group with an aldehyde or a ketone group; and
    (iii) a copolymer prepared by polycondensation of a phenolic compound with an aldehyde containing a basic group.

* * * * *